US012207560B2

(12) United States Patent
Aiba et al.

(10) Patent No.: US 12,207,560 B2
(45) Date of Patent: Jan. 21, 2025

(54) PIEZOELECTRIC ACTUATOR

(71) Applicant: Brother Kogyo Kabushiki Kaisha, Nagoya (JP)

(72) Inventors: Takashi Aiba, Nagoya (JP); Keiji Kura, Chita (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 707 days.

(21) Appl. No.: 17/471,635

(22) Filed: Sep. 10, 2021

(65) Prior Publication Data

US 2022/0102617 A1 Mar. 31, 2022

(30) Foreign Application Priority Data

Sep. 28, 2020 (JP) ................................ 2020-161756

(51) Int. Cl.

| | |
|---|---|
| ***H01L 41/047*** | (2006.01) |
| ***H10N 30/20*** | (2023.01) |
| ***H10N 30/50*** | (2023.01) |
| ***H10N 30/87*** | (2023.01) |

(52) U.S. Cl.

CPC ......... *H10N 30/50* (2023.02); *H10N 30/2047* (2023.02); *H10N 30/872* (2023.02)

(58) Field of Classification Search

CPC ... H10N 30/50; H10N 30/2047; H10N 30/572

USPC ......................................... 310/328, 365, 366

See application file for complete search history.

(56) References Cited

U.S. PATENT DOCUMENTS

| | | | | |
|---|---|---|---|---|
| 10,276,774 | B2 | 4/2019 | Nakamura | |
| 10,944,040 | B2 | 3/2021 | Nanao et al. | |
| 2010/0165057 | A1 * | 7/2010 | Morita | B41J 2/14209 347/68 |

(Continued)

FOREIGN PATENT DOCUMENTS

| | | | |
|---|---|---|---|
| JP | 2010-155407 | A | 7/2010 |
| JP | 2011-212901 | A | 10/2011 |

(Continued)

OTHER PUBLICATIONS

Jul. 9, 2024—(US)—Notice of Allowance—U.S. Appl. No. 17/471,551.

(Continued)

*Primary Examiner* — Derek J Rosenau

(74) *Attorney, Agent, or Firm* — Banner & Witcoff, Ltd.

(57) ABSTRACT

There is provided piezoelectric actuator including: vibration plate; first and second piezoelectric layers; a plurality of individual electrodes arranged on actuator surface, of the second piezoelectric layer, on first side in first direction of the second piezoelectric layer; first and second common electrodes; first surface electrode arranged on the actuator surface at an end portion in second direction orthogonal to the first direction; second surface electrode arranged on the actuator surface; and non-conductive electrodes arranged at end portions in the second direction of at least two of the actuator surface, and the first and second boundary surfaces, and which are not in conduction with any of the individual electrodes, and the first and second common electrodes. The non-conductive electrodes are arranged at least in an area of an end portion in the second direction of a stack of the vibration plate, and the first and second piezoelectric layers.

12 Claims, 13 Drawing Sheets

22 43 73 XA XB 43x 59 51 43y 55a 54b 71a 71b 63a 63b 63a1 63b1 70a 70b 54a 55b 51R X Y Z

(56) References Cited

U.S. PATENT DOCUMENTS

| | | | |
|---|---|---|---|
| 2011/0242225 | A1 | 10/2011 | Yamashita |
| 2013/0241996 | A1 | 9/2013 | Hara |
| 2015/0102835 | A1 | 4/2015 | Huygens et al. |

FOREIGN PATENT DOCUMENTS

| | | | |
|---|---|---|---|
| JP | 2012-121146 | A | 6/2012 |
| JP | 2013-188931 | A | 9/2013 |
| JP | 2014-151584 | A | 8/2014 |
| JP | 2014-189017 | A | 10/2014 |
| JP | 2016-68404 | A | 5/2016 |

OTHER PUBLICATIONS

Sep. 10, 20210—(US) Co-pending U.S. Appl. No. 17/471,551.

Sep. 3, 2024—(JP) Notice of Reasons for Refusal—JP App. No. 2020-161792, Eng Tran.

* cited by examiner

PIEZOELECTRIC ACTUATOR

CROSS REFERENCE TO RELATED APPLICATIONS

The present application claims priority from Japanese Patent Application No, 2020-161756, filed on Sep. 28, 2020, the disclosure of which is incorporated herein by reference in its entirety.

BACKGROUND

The present disclosure relates to a piezoelectric actuator.

As an exemplary piezoelectric actuator, such a piezoelectric actuator that the pressure is applied to an ink contained in a pressure chamber of an ink-jet head is known. In such piezoelectric actuator, a piezoelectric member may be formed by stacking three piezoelectric layers. Further, a plurality of individual electrodes, which are individually provided for a plurality of pressure chambers, may be arranged on an upper surface of the piezoelectric layer disposed on the upper side. Further, a first common electrode, which is common to the plurality of individual electrodes, may be arranged on a surface disposed between the lower piezoelectric layer and the middle piezoelectric layer. Further, a second common electrode, which is common to the plurality of individual electrodes, may be arranged on a surface disposed between the middle piezoelectric layer and the upper piezoelectric layer. Further, the first common electrode may be connected to a first connecting electrode which is arranged at an end portion in the scanning direction of the upper surface of the upper piezoelectric layer via through-holes formed through the middle piezoelectric layer and the upper piezoelectric layer. Further, the second common electrode may be connected to a second connecting electrode which is arranged at an end portion in the scanning direction of the upper surface of the upper piezoelectric layer via a through-hole formed through the upper piezoelectric layer.

SUMMARY

According to an aspect of the present disclosure, there is provided a piezoelectric actuator including:

a vibration plate having insulation performance at least on a first surface, of the vibration plate, disposed on a first side in a first direction of the vibration plate;

a first piezoelectric layer arranged on the first surface of the vibration plate;

a second piezoelectric layer arranged on a first surface, of the first piezoelectric layer, disposed on the first side in the first direction of the first piezoelectric layer;

a plurality of individual electrodes arranged on an actuator surface, of the second piezoelectric layer, disposed on the first side in the first direction of the second piezoelectric layer;

a first common electrode which is arranged on a first boundary surface between the vibration plate and the first piezoelectric layer and which is common to the plurality of individual electrodes;

a second common electrode which is arranged on a second boundary surface between the first piezoelectric layer and the second piezoelectric layer and which is common to the plurality of individual electrodes;

a first surface electrode which is arranged on the actuator surface at an end portion of the actuator surface in a second direction orthogonal to the first direction, and which is in conduction with the first common electrode;

a second surface electrode which is arranged on the actuator surface at an end portion of the actuator surface in the second direction, and which is in conduction with the second common electrode; and a plurality of non-conductive electrodes which is arranged at end portions in the second direction of at least two surfaces of the actuator surface, the first boundary surface, and the second boundary surface, and which is not in conduction with any of the plurality of individual electrodes, the first common electrode, and the second common electrode.

The plurality of non-conductive electrodes is arranged at least in an area of an end portion in the second direction of a stack of the vibration plate, the first piezoelectric layer, and the second piezoelectric layer, the area being positioned, in a third direction orthogonal to the first and second directions, within a range in which the plurality of individual electrodes is arranged, no electrodes other than the plurality of non-conductive electrode being arranged in the area.

DETAILED DESCRIPTION

In the case of the piezoelectric actuator described in Japanese Patent Application Laid-open No. 2014-189017, no electrode exists at the portion of the end portion in the scanning direction of the piezoelectric member disposed between the first connecting electrode and the second connecting electrode in the conveying direction. The portion of the piezoelectric member has the rigidity which is lower than those of the portions of the piezoelectric member overlapped with the first connecting electrode and the second connecting electrode. On this account, any crack tends to appear in the piezoelectric layer at the portion of the piezoelectric member when the piezoelectric actuator is pressed in order to join the piezoelectric actuator to the channel member.

An object of the present disclosure is to provide a piezoelectric actuator in which occurrence of any crack in a piezoelectric layer is suppressed.

First Embodiment

A first embodiment of the present disclosure will be explained below. In the following explanation, the X direction and the Y direction are orthogonal to the Z direction, and the X direction and the Y direction are orthogonal to one another. For example, the Z direction is the vertical direction, and the X direction and the Y direction are the horizontal directions. Note that the Z direction is an example of the "first direction" of the present invention, the Y direction is an example of the "second direction" of the present invention, and the X direction is an example of the "third direction" of the present invention. Further, the upper side in the Z direction is an example of the "first side in the first direction" of the present invention, and the lower side in the Z direction is an example of the "second side in the first direction" of the present invention.

<Overall Configuration of Printer 1>

Figure 1:
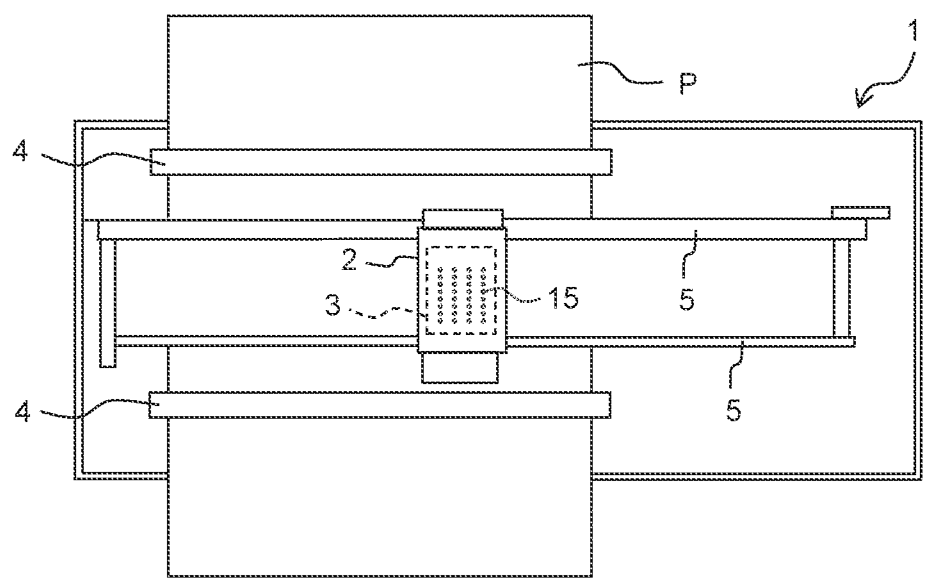
FIG. 1 depicts the overall configuration of a printer 1 including a piezoelectric actuator.
Figure 1:
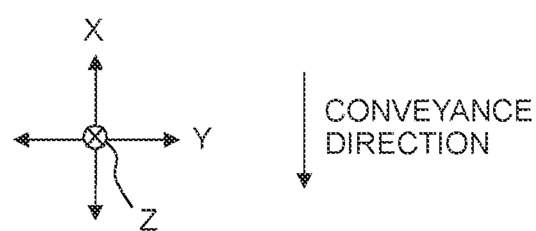

As depicted in FIG. 1, a printer 1 according to the first embodiment is provided with a carriage 2, a head 3, and two (a pair of) conveying rollers 4, The carriage 2 is supported by two guide rails 5 extending in the Y direction, and the carriage 2 is movable in the direction along the guide rails 5.

The head 3 is based on the serial type. The head 3 is carried on the carriage 2, and the head 3 is movable in the Y direction together with the carriage 2. A plurality of nozzles 15 are formed on the lower surface of the head 3.

The pair of conveying rollers 4 are arranged while interposing the carriage 2 between two conveying rollers 4 in the X direction. The pair of conveying rollers 4 are rotated in a state in which the printing paper P is interposed, and thus the printing paper P is conveyed in the conveying direction along with the X direction.

A control unit (not shown) of the printer 1 alternately performs the discharge action in which the inks are discharged from the nozzles 15 while moving the head 3 in the Y direction together with the carriage 2, and the conveying action in which the printing paper P is conveyed by a predetermined amount in the conveying direction by means of the pair of conveying rollers 4. Accordingly, an image is recorded on the printing paper P.

<Configuration of Head 3>

Figure 2:
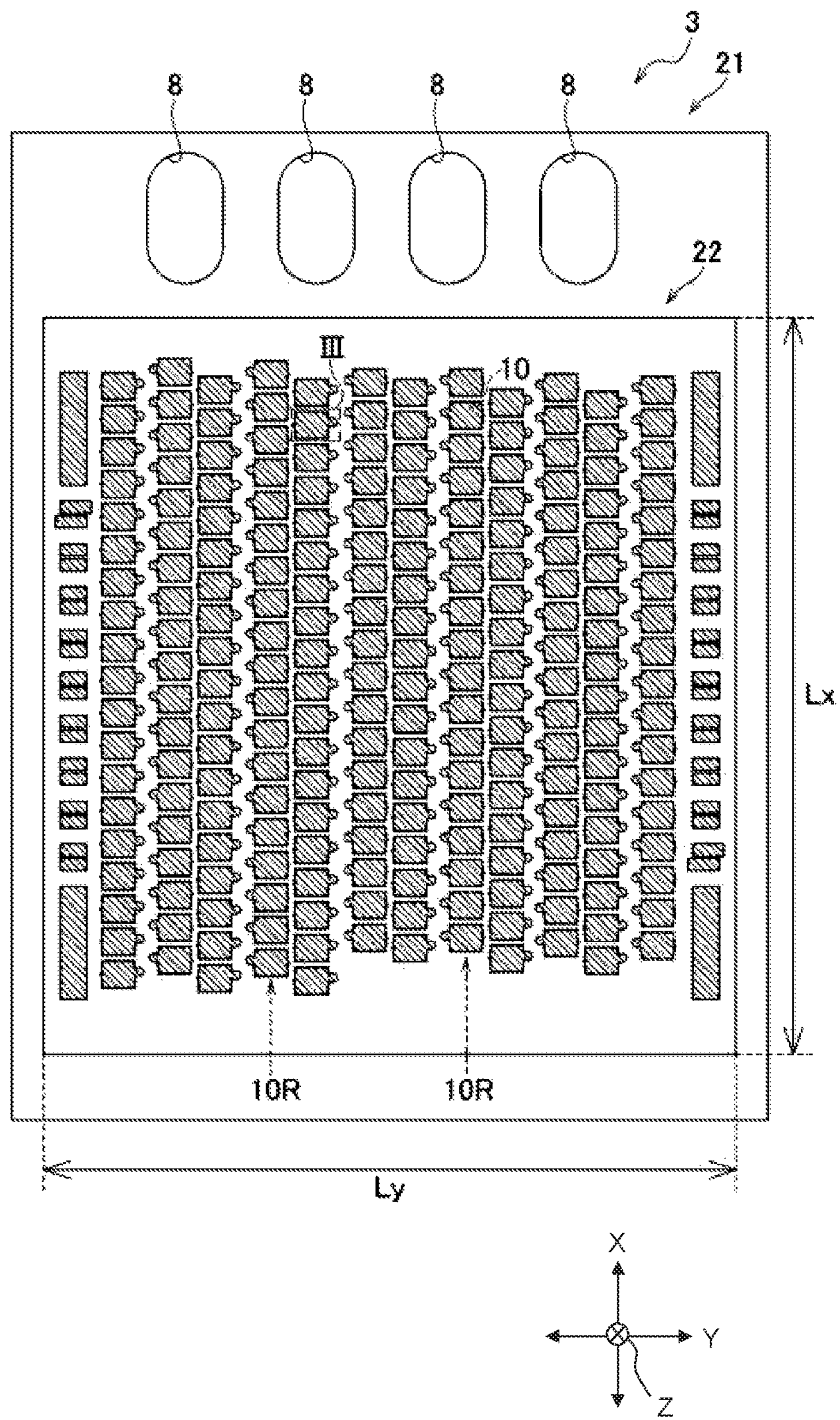
FIG. 2 is a plan view depicting a head 3 shown in FIG. 1.

As depicted in FIG. 2, the head 3 has a channel unit (a flow passage unit) 21 and a piezoelectric actuator 22.

<Channel Unit 21>

Figure 3:
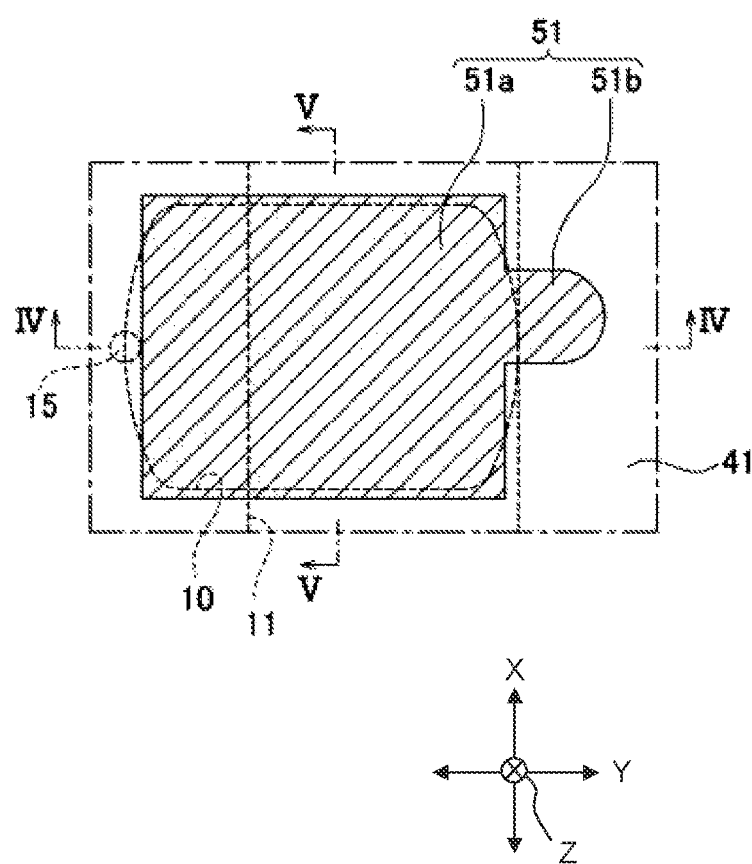
FIG. 3 is an enlarged view depicting an area. III shown in FIG. 2.
Figure 4:
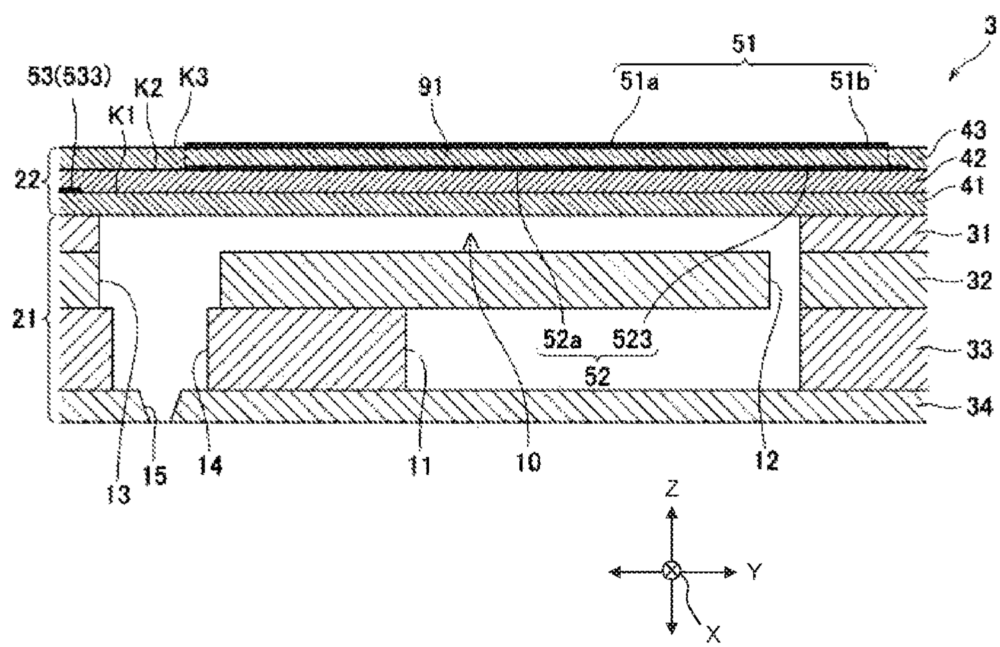
FIG. 4 is a sectional view taken along a line IV-IV shown in FIG. 3.

As depicted in FIGS. 2 to 4, the channel unit 21 has a rectangular shape as obtained by being projected in the Z direction, and the channel unit 21 is composed of four plates 31 to 34 which are stacked in the 7 direction.

The plate 31 is formed with a plurality of pressure chambers 10. The plate 32 is formed with communication channel 12, 13 each of which is provided for each of the pressure chambers 10. The communication channels 12, 13 are overlapped in the 7 direction with one end portion and the other end portion in the Y direction of the corresponding pressure chamber 10 respectively. The plate 33 is formed with communication channels 14 each of which is provided for each of the communication channels 13. The communication channel 14 is overlapped in the 7 direction with the corresponding communication channel 13. The plate 33 is further formed with twelve manifold channels 11. Each of the manifold channels 11 is provided for each of arrays 10R of the pressure chambers 10 arranged in the X direction. Each of the manifold channels 11 extends in the X direction, which is communicated via the communication channels 12 with the plurality of pressure chambers 10 belonging to the corresponding array 10R. The plate 34 is formed with the plurality of nozzles 15. Each of the nozzles 15 is overlapped in the 7 direction with the communication channel 14.

Four ink supply ports 8 are formed in an area in which the piezoelectric actuator 22 is not arranged on the upper surface of the plate 31. Each of the ink supply ports 8 is communicated with an ink cartridge (not shown), for example, via a tube (not shown). Further, each of the ink supply ports 8 is communicated with three manifold channels 11. The ink, which is supplied from the ink cartridge to each of the ink supply ports 8, is supplied to the three manifold channels 11. The ink is supplied from each of the manifold channels 11 to the plurality of pressure chambers 10 belonging to each of the arrays 10R via the communication channel 12.

<Piezoelectric Actuator 22>

As depicted in FIGS. 2 to 5, the piezoelectric actuator 22 is arranged on the upper surface of the channel unit 21. The piezoelectric actuator 22 has a vibration plate 41, a first piezoelectric layer 42, and a second piezoelectric layer 43 which are stacked in the Z direction while using the Z direction as the thickness direction respectively, a plurality of individual electrodes 51, a high electric potential electrode 52 (an example of "second common electrode" of the present invention), and a low electric potential electrode 53 (an example of "first common electrode" of the present invention).

The vibration plate 41 is arranged on the upper surface of the channel unit 21 (plate 31). The first piezoelectric layer 42 is arranged on the upper surface of the vibration plate 41. The second piezoelectric layer 43 is arranged on the upper surface of the first piezoelectric layer 42.

Each of the vibration plate 41, the first piezoelectric layer 42, and the second piezoelectric layer 43 is composed of a piezoelectric material containing a main component of, for example, lead zirconate titanate as a mixed crystal of titanic acid and lead zirconate. However, the vibration plate 41 may be composed of an insulating material other than the piezoelectric material. Alternatively, the vibration plate 41 may be formed, for example, by an ink separation layer which is composed of, for example, a metal material such as stainless steel or the like or a synthetic resin material and which is arranged on the upper surface of the channel unit 21, and an insulating layer which is composed of an insulating material such as a piezoelectric material or the like and which is arranged on the upper surface of the ink separation layer. That is, it is appropriate for the vibration plate 41 that at least a portion for forming the upper surface thereof has the insulation performance.

Each of the vibration plate 41, the first piezoelectric layer 42, and the second piezoelectric layer 43 has the same thickness (length in the Z direction) of, for example, about 5 μm. Further, in the case of the piezoelectric actuator 22, as described later on, electrodes are arranged on a first boundary surface K1 which is the surface disposed between the vibration plate 41 and the first piezoelectric layer 42, a second boundary surface K2 which is the surface disposed between the first piezoelectric layer 42 and the second piezoelectric layer 43, and an actuator surface K3 which is the upper surface of the second piezoelectric layer 43. On the other hand, no electrode is arranged on the lower surface of the vibration plate 41. That is, in the case of the piezoelectric actuator 22, the electrodes are arranged in a biased manner toward the upper side. On account of the fact as described above, a neutral surface C1 of the piezoelectric actuator 22 is positioned slightly upwardly from the central portion in the Z direction of the first piezoelectric layer 42. In this context, the neutral surface C1 is a surface that exists at the center in the thickness direction of a stack composed of the vibration plate 41, the first piezoelectric layer 42, the second piezoelectric layer 43, and the electrodes as described later on. Accordingly, the second boundary surface K2 is disposed nearer to the neutral surface C1 as compared with the first boundary surface K1 (that is, the distance between the neutral surface C1 and the second boundary surface K2 is smaller than the distance between the neutral surface C1 and the first boundary surface K1).

Further, as for the vibration plate 41, the first piezoelectric layer 42, and the second piezoelectric layer 43, the length Ly in the Y direction is shorter than the length Lx in the X direction. For example, Ly is about 30 to 35 mm, and Lx is about 35 to 40 mm. Accordingly, in the case of the piezoelectric actuator 22, the length in the Y direction is shorter than the length in the X direction.

As depicted in FIG. 3, the plurality of individual electrodes 51 are arranged while corresponding to the pressure chambers 10 respectively on the actuator surface K3. Each of the individual electrodes 51 has a main portion 51*a* and a protruding portion 51*b*. The main portion 51*a* is overlapped in the Z direction with an approximately entire region of the corresponding pressure chamber 10. The protruding portion 51*b* protrudes in the Y direction from the main portion 51*a*, and the protruding portion 51*b* is not overlapped in the Z direction with the corresponding pressure chamber 10. The protruding portion 51*b* is provided with a contact which is to be electrically connected to COF (Chip On Film) (not shown). Driver IC (not shown), which is mounted on COF, selectively applies any one of the high electric potential (VDD electric potential) and the low electric potential (GND electric potential) individually to each of the individual electrodes 51 via the wiring of COF in accordance with the control performed by the control unit.

Figure 6:
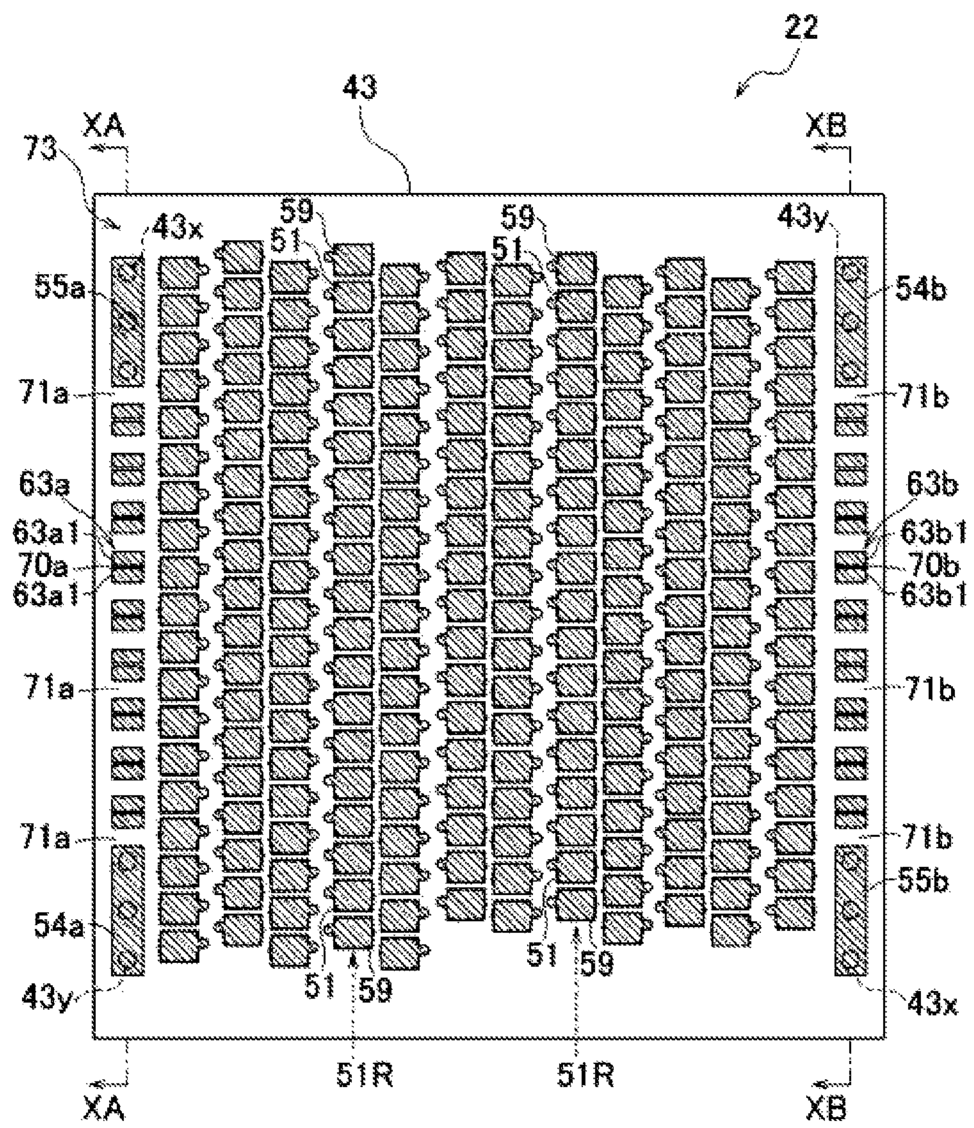
FIG. 6 is a plan view depicting an actuator surface K3.

As depicted in FIG. 6, the plurality of individual electrodes 51 are arranged in the X direction in an area of the actuator surface K3 except for both end portions in the X direction and both end portions in the Y direction. The plurality of individual electrodes 51 form a plurality of driving electrode arrays 51R corresponding to the arrays 10R of the pressure chambers 10 (see FIG. 2) respectively. The plurality of driving electrode arrays 51R are aligned in the Y direction.

Dummy electrodes 59 are provided on the first side (upper side as viewed in FIG. 6) and the second side (lower side as viewed in FIG. 6) in the X direction respectively for each of the driving electrode arrays 51R, The dummy electrode 59 has the same size and the same shape as those of the individual electrode 51 belonging to the corresponding driving electrode array 51R. The dummy electrodes 59 are aligned at equal intervals in the X direction together with the individual electrodes 51. The dummy electrode 59 is not electrically connected to CCF, and no electric potential is applied to the dummy electrodes 59. Owing to the provision of the dummy electrodes 59, even if the thickness of the dummy electrode 59 disposed at the end portion in the X direction is decreased during the electrode formation by means of the screen printing in the X direction, then the thickness of the individual electrode 51 is not affected, and the individual electrode 51 can be appropriately formed. Further, it is possible to suppress the difference in the shrinkage amount caused by the electrode formation between the individual electrode 51 which is disposed at the center in the X direction and the individual electrode 51 which is disposed at the end portion in the X direction in relation to each of the driving electrode arrays 51R. Consequently, it is possible to suppress the dispersion of the discharge amounts from the plurality of nozzles 15 corresponding to each of the driving electrode arrays 51R.

First surface electrodes 54*a*, 54*b*, second surface electrodes 55*a*, 55*b*, and a plurality of non-conductive electrodes 63*a*, 63*b* (an example of "first non-conductive electrodes" of the present invention) are arranged on the actuator surface K3 in addition to the individual electrodes 51 and the dummy electrodes 59.

Figure 9A:
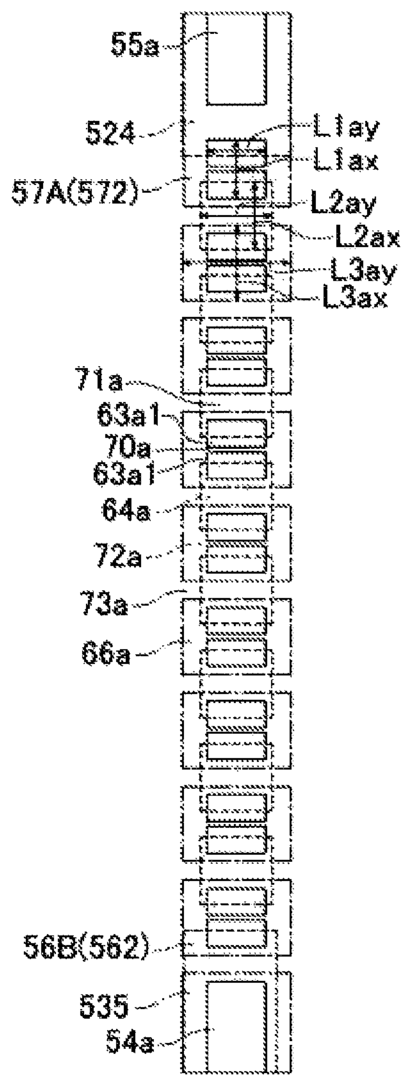
FIG. 9A explains the positional relationship of electrodes as obtained by the projection in the Z direction at an end portion disposed on the first side in the Y direction of the piezoelectric actuator 22, and FIG. 9B explains the positional relationship of electrodes as obtained by the projection in the Z direction at an end portion disposed on the second side in the Y direction of the piezoelectric actuator 22.
Figure 9A:
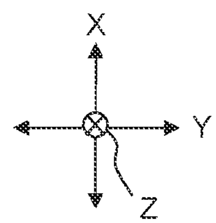
Figure 9B:
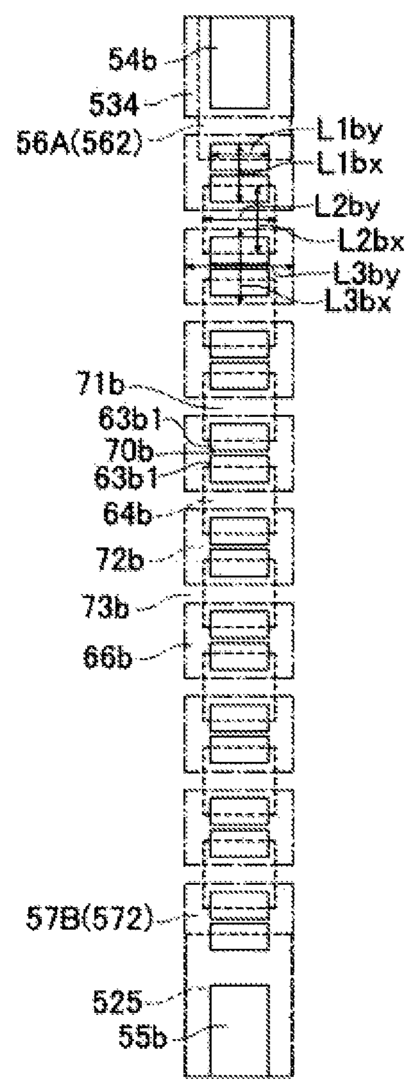
Figure 9B:
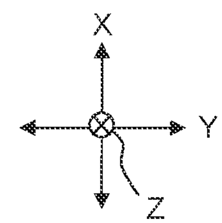
Figure 10A:
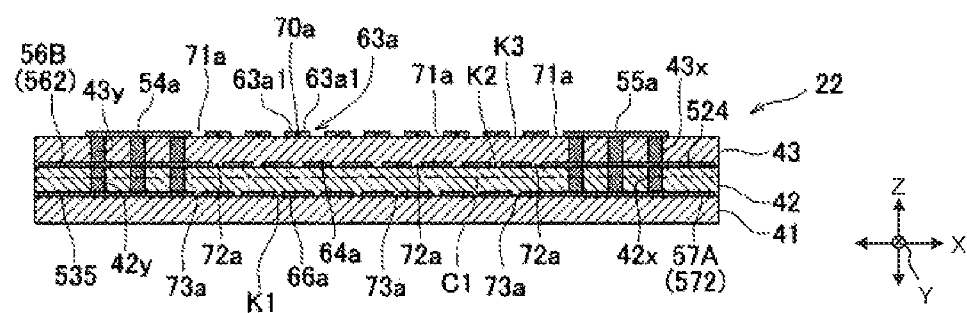
FIG. 10A is a sectional view taken along a line XA-XA shown in FIGS. 6, 7, and 8.
Figure 10B:
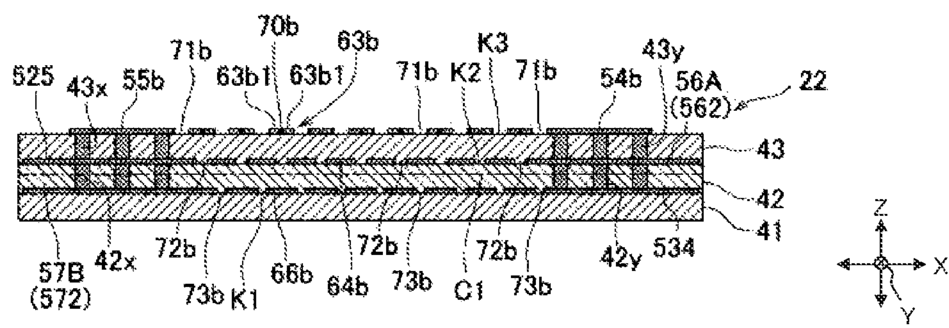
FIG. 10B is a sectional view taken along a line XB-XB shown in FIGS. 6, 7, and 8.

As depicted in FIGS. 6, 9A, and 10A, the first surface electrode 54*a* is arranged at the second end portion in the X direction (lower-left end portion as viewed in FIG. 6) in the area of the first end portion in the Y direction (left end portion as viewed in FIG. 6) of the actuator surface K3. As depicted in FIGS. 6, 9B, and 10B, the first surface electrode 54*b* is arranged at the first end portion in the X direction (upper-right end portion as viewed in FIG. 6) in the area of the second end portion in the Y direction (right end portion as viewed in FIG. 6) of the actuator surface K3. The first surface electrodes 54*a*, 54*b* extend in the X direction.

As depicted in FIGS. 6, 9A, and 10A, the second surface electrode 55*a* is arranged at the first end portion in the X direction (upper-left end portion as viewed in FIG. 6) in the area of the first end portion in the Y direction (left end portion as viewed in FIG. 6) of the actuator surface K3. As depicted in FIGS. 6, 9B, and 10B, the second surface electrode 55*b* is arranged at the second end portion in the X direction (lower-right end portion as viewed in FIG. 6) in the area of the second end portion in the Y direction (right end portion as viewed in FIG. 6) of the actuator surface K3. The second surface electrodes 55*a*, 55*b* extend in the X direction.

Further, the position in the Y direction of the first surface electrode 54*a* is the same as the position in the Y direction of the second surface electrode 55*a*. Then, the first surface electrode 54*a* and the second surface electrode 55*a* are arranged while providing a space therebetween in the X direction. Further, the position in the Y direction of the first surface electrode 54*b* is the same as the position in the Y direction of the second surface electrode 55*b*. Then, the first surface electrode 54*b* and the second surface electrode 55*b* are arranged while providing a space therebetween in the X direction.

As depicted in FIGS. 6, 9A, and 10A, the plurality of non-conductive electrodes 63*a* are arranged between the first surface electrode 54*a* and the second surface electrode 55*a*, and the plurality of non-conductive electrodes 63*a* are aligned in the X direction. Accordingly, in the X direction, gaps 71*a* (an example of "first gap" of the present invention) are formed respectively between the first surface electrode 54*a* and the non-conductive electrode 63*a* disposed on the second side (lower side as viewed in FIG. 6) of any other non-conductive electrode 63*a*, between the second surface electrode 55*a* and the non-conductive electrode 63*a* disposed on the first side (upper side as viewed in FIG. 6) of any other non-conductive electrode 63*a*, and between the two adjoining non-conductive electrodes 63*a*.

As depicted in FIGS. 6, 9B, and 10B, the plurality of non-conductive electrodes 63*b* are arranged between the first surface electrode 54*b* and the second surface electrode 55*b*, and the plurality of non-conductive electrodes 63*b* are aligned in the X direction. Accordingly, in the X direction, gaps 71*b* (an example of "first gap" of the present invention) are formed respectively between the first surface electrode 54*b* and the non-conductive electrode 63*b* disposed on the first side (upper side as viewed in FIG. 6) of any other non-conductive electrode 63*b*, between the second surface electrode 55*b* and the non-conductive electrode 63*b* disposed on the second side (lower side as viewed in FIG. 6) of any other non-conductive electrode 63*b*, and between the two adjoining non-conductive electrodes 63*b*.

Further, each of the non-conductive electrodes 63*a* is divided into two electrode portions 63*a*1 which are aligned in the X direction. Further, each of the non-conductive electrodes 63*b* is divided into two electrode portions 63*b*1 which are aligned in the X direction. The shapes of the electrode portions 63*a*1, 63*b*1, which are obtained by the projection in the Z direction, are oblongs (rectangles) in which the Y direction is the longitudinal direction. Further, the lengths in the Y direction of the electrode portions 63*a*1, 63*b*1 are approximately the same as the lengths in the Y direction of the first surface electrode 54*a*, 54*b* and the second surface electrode 55*a*, 55*b*. Then, in the Y direction, the electrode portions 63*a*1 are arranged in the same range as the range in which the first surface electrode 54*a* and the second surface electrode 55*a* are arranged. Further, in the V direction, the electrode portions 63*b*1 are arranged in the same range as the range in which the first surface electrode 54*b* and the second surface electrode 55*b* are arranged. Further, in the X direction, the length in the X direction of the gap 70*a* between the two electrode portions 63*a*1 of each of the non-conductive electrodes 63*a* is shorter than the length in the X direction of the gap 71*a*, Further, the length in the X direction of the gap 70*b* between the two electrode portions 63*b*1 of each of the non-conductive electrodes 63*b* is shorter than the length in the X direction of the gap 71*b*.

In this context, the reason, why the non-conductive electrodes 63*a*, 63*b* are divided into the two electrode portions 63*a*1 and the two electrode portions 63*b*1 respectively, is that it is intended to suppress any warpage at the end portions in the Y direction of the piezoelectric actuator 22 during the heating when the piezoelectric actuator is manufactured. However, unlike the foregoing configuration, each of the non-conductive electrodes 63*a*, 63*b* may be one electrode which is not divided.

The first surface electrodes 54*a*, 54*b* and the second surface electrodes 55*a*. 55*b* are electrically connected to COF (not shown). The driver IC (not shown) applies the low electric potential (GND electric potential) to the first surface electrodes 54*a*, 54*b* and applies the high electric potential (VDD electric potential) to the second surface electrodes 55*a*, 55*b* via the wiring of COF in accordance with the control performed by the control unit. On the other hand, the non-conductive electrodes 63*a*, 63*b* are not electrically connected to COF. Further, the non-conductive electrodes 63*a*, 63*b* are not in conduction with any one of the individual electrode 51, the high electric potential electrode 52, and the low electric potential electrode 53, and no electric potential is applied to the non-conductive electrodes 63*a*, 63*b*.

Figure 5:
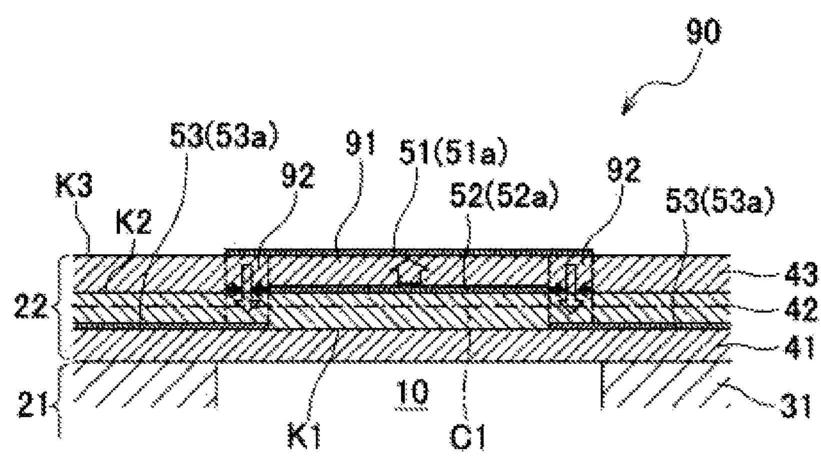
FIG. 5 is a sectional view taken along a line V-V shown in FIG. 3.
Figure 5:
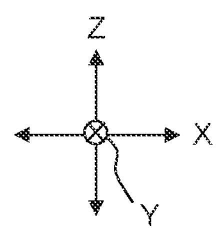

As depicted in FIGS. 4 and 5, the high electric potential electrode 52 is arranged on the second boundary surface 12.

Further, as depicted in FIGS. 7, 9A, 9B, 10A, and 10B, the high electric potential electrode 52 includes two stern portions 521, 522 which extend in the Y direction, a plurality of branch portions 523 which are branched from the respective stem portions 521, 522 and which extend in the X direction, a plurality of individual portions 52*a* which are arranged in the X direction and which are connected by the branch portions 523 and connecting portions 524, 525 which are overlapped in the Z direction with the second surface electrodes 55*a*. 55*b*, The respective individual portions 52*a* correspond to the respective pressure chambers 10, and they are overlapped in the Z direction with the central portions in the X direction of the respective pressure chambers 10 (see FIG. 5). The respective stem portions 521, 522 connect the plurality of branch portions 523.

Figure 7:
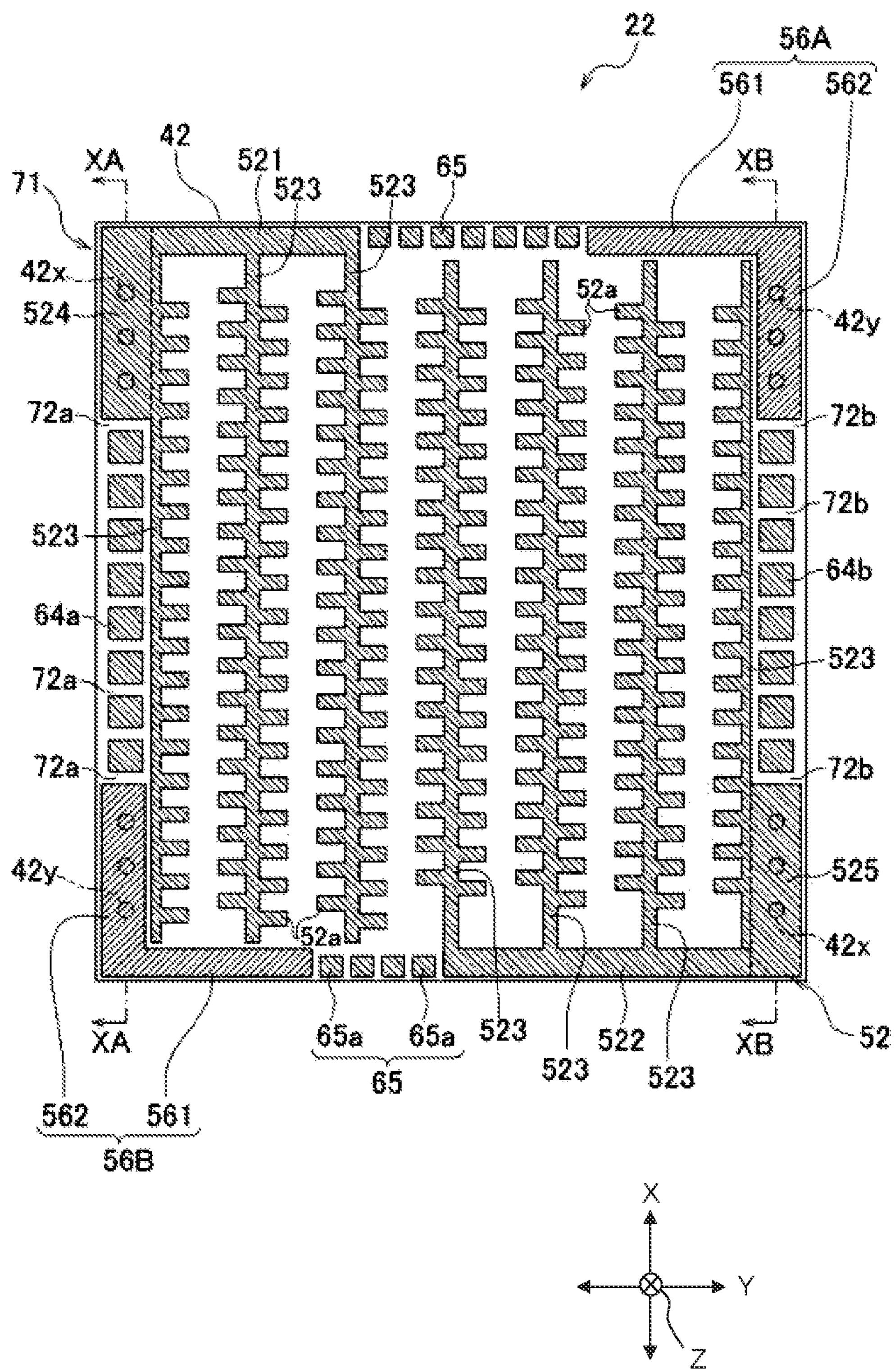
FIG. 7 is a plan view depicting an upper surface of a first piezoelectric layer 42.

The stem portion 521 is arranged at the portion of the second boundary surface K2 disposed on the first side in the Y direction (left side as viewed in FIG. 7) at the first end portion in the X direction (upper end portion as viewed in FIG. 7). The stem portion 522 is arranged at the portion of the second boundary surface K2 disposed on the second side in the V direction (right side as viewed in FIG. 7) at the second end portion in the X direction (lower end portion as viewed in FIG. 7). The stem portions 521, 522 extend in the Y direction.

The three branch portions 523 extend in the X direction from the stem portion 521 from the first end in the X direction (upper end as viewed in FIG. 7) of the second boundary surface K2 toward the second end (lower end as viewed in FIG. 7). The four branch portions 523 extend in the X direction from the stem portion 522 from the second end in the X direction (lower end as viewed in FIG. 7) of the second boundary surface K2 toward the first end (upper end as viewed in FIG. 7). The branch portions 523, which are branched from the respective stem portions 521, 522, are aligned in the Y direction.

As depicted in FIGS. 7, 9A, and 10A, the connecting portion 524 extends in the X direction at the first end portion in the Y direction (left end portion as viewed in FIG. 7) of the second boundary surface K2. The connecting portion 524 is overlapped in the Z direction with the second surface electrode 55*a*, the end portion on the first side in the X direction of the non-conductive electrode 63*a* disposed on the first side in the X direction of any other non-conductive electrode 63*a*, and the gap 71*a* disposed between these electrodes. Further, the connecting portion 524 has the length in the Y direction which is longer than the lengths in the Y direction of the first surface electrode 54*a* and the second surface electrode 55*a*. Then, the connecting portion 524 extends to the outer side as compared with the first surface electrode 54*a* and the second surface electrode 55*a* on the both sides in the Y direction. Further, the connecting portion 524 is connected to the first end in the Y direction (left end as viewed in FIG. 7) of the stem portion 521, and the connecting portion 524 is connected to the branch portion 523 positioned on the first side in the Y direction (left side as viewed in FIG. 7) of any other branch portion 523 branched from the stem portion 521.

As depicted in FIGS. 7, 9B, and 10B, the connecting portion 525 extends in the X direction at the second end portion in the Y direction (right end portion as viewed in FIG. 7) of the second boundary surface K2. The connecting portion 525 is overlapped in the Z direction with the second surface electrode 55*b*, the end portion on the second side in the X direction of the non-conductive electrode 63*h* disposed on the second side in the X direction of any other non-conductive electrode 63*b*, and the gap 71*b* disposed between these electrodes. Further, the connecting portion 525 has the length in the Y direction which is longer than the lengths in the Y direction of the first surface electrode 54*b* and the second surface electrode 55*b*. Then, the connecting portion 525 extends to the outer side as compared with the first surface electrode 54*b* and the second surface electrode 55*b* on the both sides in the Y direction. Further, the connecting portion 525 is connected to the second end in the Y direction (right end as viewed in FIG. 7) of the stem portion 522, and the connecting portion 525 is connected to the branch portion 523 positioned on the second side in the Y direction (right side as viewed in FIG. 7) of any other branch portion 523 branched from the stem portion 522.

The connecting portions 524, 525 are in conduction with the second surface electrodes 55*a*, 55*b* respectively via through-holes 43*x* formed through the second piezoelectric layer 43.

Connecting electrodes 56A, 56B, pluralities of non-conductive electrodes 64*a*, 64*b* (an example of "third non-conductive electrode" of the present invention), and a plurality of non-conductive electrodes 65 are arranged on the second boundary surface K2 in addition to the high electric potential electrode 52.

As depicted in FIG. 7, the connecting electrodes 56A, 56B have L-shaped forms respectively, and they have portions 561 which extend in the Y direction and portions 562 which extend in the X direction. The connecting electrode 56A is arranged at a corner portion which is disposed on first side in the X direction of the second boundary surface K2 (upper side as viewed in FIG. 7) and which is disposed on the second side in the Y direction (right side as viewed in FIG. 7). The connecting electrode 56B is arranged at a corner portion which is disposed on the second side in the X direction of the second boundary surface K2 (lower side as viewed in FIG. 7) and which is disposed on the first side in the Y direction (left side as viewed in FIG. 7).

As depicted in FIGS. 7, 9B, and 10B, the portion 562 of the connecting electrode 56A is overlapped in the Z direction with the first surface electrode 54*b*, the end portion on the first side in the X direction of the non-conductive electrode 63*b* disposed on the first side in the X direction of any other non-conductive electrode 63*b*, and the gap 71*b* disposed between these electrodes. Further, the portion 562 of the connecting electrode 56A has the length in the Y direction which is longer than the lengths in the Y direction of the first surface electrode 54*b* and the second surface electrode 55*b*. Then, the portion 562 of the connecting electrode 56A extends to the outer side as compared with the first surface electrode 54*b* and the second surface electrode 55*b* on the both sides in the Y direction. Further, the portion 562 of the connecting electrode 56A is in conduction with the first surface electrode 54*b* via a through-hole 43*y* formed through the second piezoelectric layer 43.

As depicted in FIGS. 7, 9A, and 10A, the portion 562 of the connecting electrode 56B is overlapped in the Z direction with the first surface electrode 54*a*, the end portion on the second side in the X direction of the non-conductive electrode 63*a* disposed on the second side in the X direction of any other non-conductive electrode 63*a*, and the gap 71*a* disposed between these electrodes. Further, the portion 562 of the connecting electrode 56B has the length in the Y direction which is longer than the lengths in the Y direction of the first surface electrode 54*a* and the second surface electrode 55*a*. Then, the portion 562 of the connecting electrode 56B extends to the outer side as compared with the first surface electrode 54*a* and the second surface electrode 55*a* on the both sides in the Y direction. Further, the portion 562 of the connecting electrode 56B is in conduction with the first surface electrode 54*a* via a through-hole 43*y* formed through the second piezoelectric layer 43.

The portion 561 of the connecting electrode 56A is overlapped in the X direction with the first and second branch portions 523 as counted from the right as viewed in FIG. 7, and the portion 561 is overlapped in the X direction with the three arrays disposed on the right side as viewed in FIG. 6 of the plurality of driving electrode arrays 51R. The portion 561 of the connecting electrode 56B is overlapped in the X direction with the first and second branch portions 523 as counted from the left as viewed in FIG. 7, and the portion 561 is overlapped in the X direction with the three arrays disposed on the left side as viewed in FIG. 6 of the plurality of driving electrode arrays 51R.

As depicted in FIGS. 7, 9A, and 10A, the plurality of non-conductive electrodes 64*a* are arranged between the connecting portion 524 and the portion 562 of the connecting electrode 56B, and the plurality of non-conductive electrodes 64*a* are aligned while providing spaces in the X direction. Further, each of the non-conductive electrodes 64*a* extends in the X direction to range over the two adjoining non-conductive electrodes 63*a*. Then, each of the non-conductive electrodes 64*a* is overlapped in the Z direction with the end portion on the second side of the non-conductive electrode 63*a*, among the two adjoining non-conductive electrodes 63*a*, disposed on the first side in the X direction, the end portion on the first side of the non-conductive electrode 63*a*, among the two adjoining non-conductive electrodes 63*a*, disposed on the second side in the X direction, and the gap 71*a* disposed between the two adjoining non-conductive electrodes 63*a*.

Further, the plurality of non-conductive electrodes 64*a* are arranged as described above, and thus the gaps 72*a*, which are overlapped in the Z direction with the central portions in the X direction of the non-conductive electrodes 63*a*, are formed respectively between the connecting portion 524 and the non-conductive electrode 64*a* disposed on the first side in the X direction of any other non-conductive electrode 64*a*, between the portion 562 of the connecting electrode 56B and the non-conductive electrode 64*a* disposed on the second side in the X direction of any other non-conductive electrode 64*a*, and between the two adjoining non-conductive electrodes 64*a*.

Further, the length L2*ax* in the X direction of the non-conductive electrode 64*a* is longer than the length L1*ax* in the X direction of the non-conductive electrode 63*a* (length between the end on the first side of the electrode portion 63*a*1 disposed on the first side and the end on the second side of the electrode portion 63*a*1 disposed on the second side in the X direction). Further, the length L2*ay* in the Y direction of the non-conductive electrode 64*a* is longer than the length L1*ay* in the Y direction of the non-conductive electrode 63*a*. The non-conductive electrode 64*a* extends to the outer side as compared with the non-conductive electrode 63*a* on the both sides in the Y direction. Accordingly, the area (square measure) of the non-conductive electrode 64*a* is larger than the area (square measure) of the non-conductive electrode 63*a*.

As depicted in FIGS. 7, 9B, and 10B, the plurality of non-conductive electrodes 64*b* are arranged between the connecting portion 525 and the portion 562 of the connecting electrode 56A, and the plurality of non-conductive electrodes 64*b* are aligned while providing spaces in the X direction. Further, each of the non-conductive electrodes 64*b* extends in the X direction to range over the two adjoining non-conductive electrodes 63*b*. Then, each of the non-conductive electrodes 64*b* is overlapped in the Z direction with the end portion on the second side of the non-conductive electrode 63*b*, among the two adjoining non-conductive electrodes 63*b*, disposed on the first side in the X direction, the end portion on the first side of the non-conductive electrode 63*b*, among the two adjoining non-conductive electrodes 63*b*, disposed on the second side in the X direction, and the gap 71*b* disposed between the two adjoining non-conductive electrodes 63*b*.

Then, the plurality of non-conductive electrodes 64*b* are arranged as described above, and thus the gaps 72*b*, which are overlapped in the Z direction with the central portions in the X direction of the non-conductive electrodes 63*b*, are formed respectively between the connecting portion 525 and the non-conductive electrode 64*b* disposed on the second side in the X direction of any other non-conductive electrode 64*b*, between the portion 562 of the connecting electrode 56A and the non-conductive electrode 64*b* disposed on the first side in the X direction of any other non-conductive electrode 64*b*, and between the two adjoining non-conductive electrodes 64*b*.

Further, the length L2*bx* in the X direction of the non-conductive electrode 64*b* is longer than the length L1*bx* in the X direction of the non-conductive electrode 63*b* (length between the end on the first side of the electrode portion 63*b*1 disposed on the first side and the end on the second side of the electrode portion 63*b*1 disposed on the second side in the X direction). Further, the length L2*by* in the Y direction of the non-conductive electrode 64*b* is longer than the length L1 by in the Y direction of the non-conductive electrode 63*b*. The non-conductive electrode 64*b* extends to the outer side as compared with the non-conductive electrode 63*b* on the both sides in the Y direction. Accordingly, the area (square measure) of the non-conductive electrode 64*b* is larger than the area (square measure) of the non-conductive electrode 63*b*.

The plurality of non-conductive electrodes 65 are arranged between the stem portion 521 and the portion 561 of the connecting electrode 56A and between the stem portion 522 and the portion 561 of the connecting electrode 56B, and they are aligned while providing spaces therebetween in the V direction.

The non-conductive electrodes 64*a*, 64*b*, 65 are not in conduction with any one of the individual electrode 51, the high electric potential electrode 52, and the low electric potential electrode 53, and no electric potential is applied to the non-conductive electrodes 64*a*, 64*b*, 65.

As depicted in FIGS. 4 and 5, the low electric potential electrode 53 is arranged on the first boundary surface K1.

Figure 8:
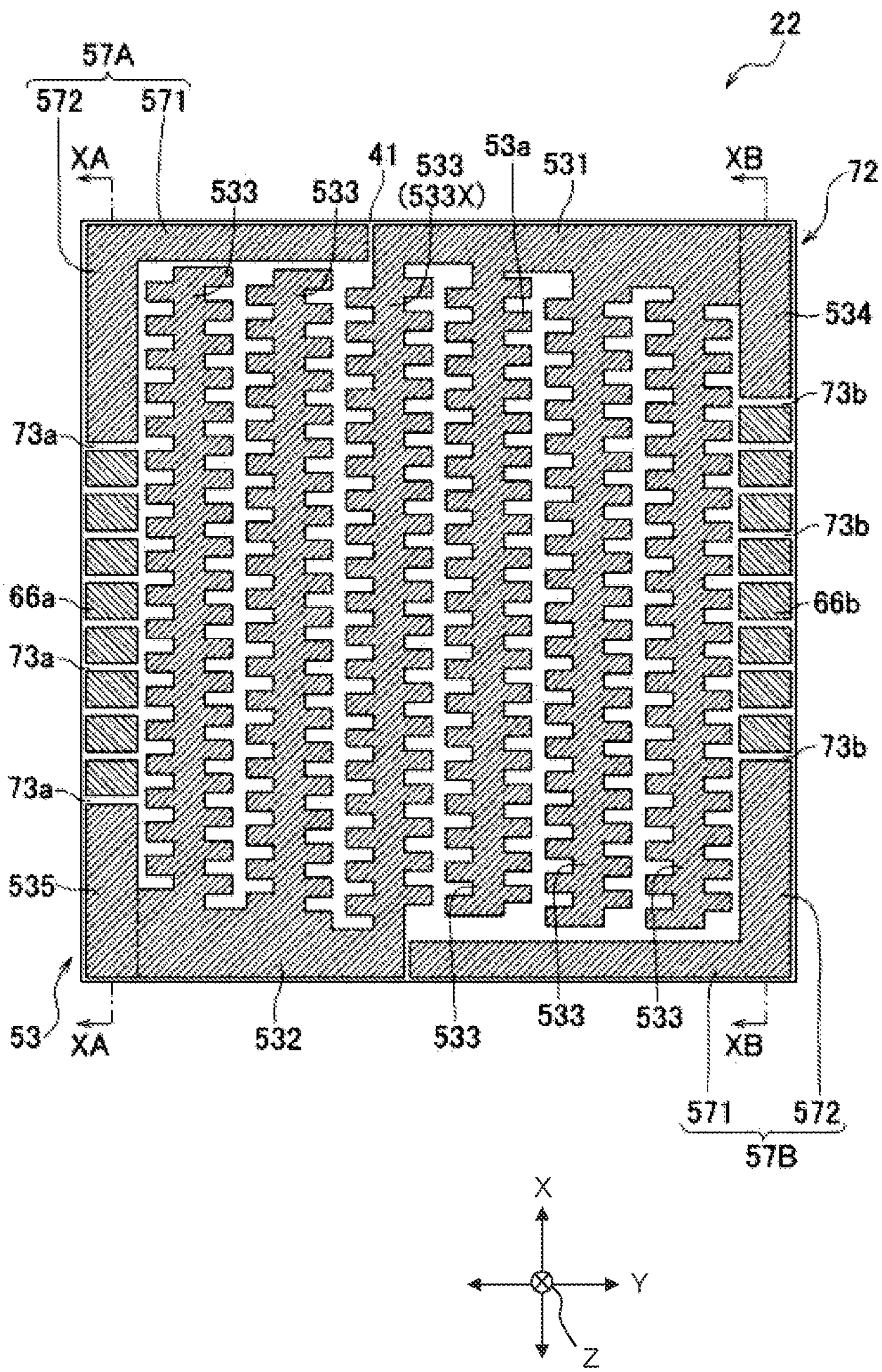
FIG. 8 is a plan view depicting an upper surface of a vibration plate 41.

As depicted in FIGS. 8, 10A, and 10B, the low electric potential electrode 53 includes two stem portions 531, 532 which extend in the Y direction, a plurality of branch portions 533 which are branched from the respective stem portions 531, 532 and which extend in the X direction, a plurality of individual portions 53*a* which are arranged in the X direction and which are connected by the branch portions 533, and connecting portions 534, 535 which are overlapped in the Z direction with the first surface electrodes 54*b*. 54*a* (see FIG. 6) respectively. Except for the individual portions 53*a* which are included in the plurality of individual portions 53*a* arranged in the X direction and which are positioned at both ends in the X direction of the arrangement, each of the individual portions 53*a* spreads over or extends over the two pressure chambers 10 disposed adjacently to one another in the X direction and has portions which are overlapped in the Z direction with the end portions in the X direction of the two pressure chambers (see FIG. 5). The individual portions 53*a*, which are positioned at both ends in the X direction of the arrangement, each has a portion which is overlapped in the Z direction with the end portion in the X direction of one pressure chamber 10. The respective stem portions 531, 532 connect the plurality of branch portions 533.

The stem portion 531 is arranged at the portion of the first boundary surface K1 disposed at the first end portion in the X direction (upper end portion as viewed in FIG. 8) on the second side in the Y direction (right side as viewed in FIG. 8). The stern portion 532 is arranged at the portion of the first boundary surface K1 disposed at the second end portion in the X direction (lower end portion as viewed in FIG. 8) on the first side in the Y direction (left side as viewed in FIG. 8). The stem portions 531, 532 extend in the Y direction.

The four branch portions 533 extend in the X direction from the stem portion 531 from the first end in the X direction (upper end as viewed in FIG. 8) of the first boundary surface K1 toward the second end (lower end as viewed in FIG. 8). The three branch portions 533 extend in the X direction from the stem portion 532 from the second end in the X direction (lower end as viewed in FIG. 8) of the first boundary surface K1 toward the second end (upper end as viewed in FIG. 8).

The branch portions 533, which are branched from the respective stern portions 531, 532, are aligned in the Y direction. In this case, the branch portion 533X, which is positioned on the first side in the Y direction of any other branch portion 533 branched from the stem portion 531 (leftmost among them as viewed in FIG. 8), is connected to the stem portion 532. In other words, the stein portion 533X, which is positioned on the first side in the Y direction of any other branch portion 533 branched from the stem portion 531 (leftmost among the four branch portions 533 as viewed in FIG. 8), is the same as the branch portion 533X which is positioned on the second side in the Y direction of the any other branch portion 533 branched from the stern portion 532 (rightmost among the three branch portions 533 as viewed in FIG. 9). As for the branch portion 533X, one end in the X direction is connected to the stem portion 531, and the other end in the X direction is connected to the stein portion 532.

The connecting portion 534 extends in the X direction at the second end portion in the V direction of the first boundary surface K1 (right end portion as viewed in FIG. 8). The connecting portion 534 is connected to the second end in the Y direction (right end as viewed in FIG. 8) of the stem portion 531.

Further, as depicted in FIGS. 8, 9A, and 10A, the connecting portion 534 is overlapped in the Z direction with the portion 562 of the connecting electrode 56A. Further, the length in the Y direction of the connecting portion 534 is longer than the lengths in the Y direction of the first surface electrode 54*b* and the second surface electrode 55*b*. Then, the connecting portion 534 extends to the outer side as compared with the first surface electrode 54*b* and the second surface electrode 55*b* on the both sides in the Y direction. Further, the connecting portion 534 is in conduction with the portion 562 of the connecting electrode 56A via a through-hole 42*y* formed through the first piezoelectric layer 42.

As depicted in FIG. 8, the connecting portion 535 extends in the X direction at the first end portion in the Y direction of the first boundary surface K1 (left end portion as viewed in FIG. 8). The connecting portion 535 is connected to the first end in the direction (left end as viewed in FIG. 8) of the stem portion 532.

Further, as depicted in FIGS. 8, 9B, and 10B, the connecting portion 535 is overlapped in the Z direction with the portion 562 of the connecting electrode 56B. Further, the length in the Y direction of the connecting portion 535 is longer than the lengths in the Y direction of the first surface electrode 54*a* and the second surface electrode 55*a*. Then, the connecting portion 535 extends to the outer side as compared with the first surface electrode 54*a* and the second surface electrode 55*a* on the both sides in the Y direction. Further, the connecting portion 535 is in conduction with the portion 562 of the connecting electrode 56B via a through-hole 42*y* formed through the first piezoelectric layer 42.

Connecting electrodes 57A, 57B and a plurality of non-conductive electrodes 66*a*, 66*b* (an example of "second non-conductive electrodes" of the present invention) are arranged on the first boundary surface K1 in addition to the low electric potential electrode 53.

Each of the connecting electrodes 57A, 57B has an L-shaped form, having a portion 571 which extends in the Y direction and a portion 572 which extends in the X direction. The connecting electrode 57A is arranged at a corner portion which is disposed on the first side in the X direction of the first boundary surface K1 (upper side as viewed in FIG. 9) and which is disposed on the first side in the Y direction (left side as viewed in FIG. 9). The connecting electrode 57B is arranged at a corner portion which is disposed on the second side in the X direction of the first boundary surface K1 (lower side as viewed in FIG. 9) and which is disposed on the second side in the Y direction (right side as viewed in FIG. 9).

As depicted in FIGS. 9A and 10A, the portion 572 of the connecting electrode 57A is overlapped in the Z direction with the connecting portion 524, the end portion on the first side of the non-conductive electrode 64*a* disposed on the first side in the X direction of any other non-conductive electrode 64*a*, and the gap 72*a* disposed between these electrodes. Further, the portion 572 of the connecting electrode 57. A has the length in the Y direction which is longer than those of the first surface electrode 54*a* and the second surface electrode 55*a*. The portion 572 of the connecting electrode 57A extends to the outer side as compared with the first surface electrode 54*a* and the second surface electrode 55*a* on the both sides in the Y direction. Further, the portion 572 of the connecting electrode 57A is in conduction with the connecting portion 524 via a through-hole 42*x* formed through the first piezoelectric layer 42.

The portion 571 of the connecting electrode 57A is overlapped in the X direction with the first and second branch portions 533 as counted from the left as viewed in FIG. 8, and the portion 571 is overlapped in the X direction with the five arrays disposed on the left side as viewed in FIG. 6 of the plurality of driving electrode arrays 51R. Further, the portion 571 of the connecting electrode 57A is overlapped in the Z direction with the stem portion 521 of the high electric potential electrode 52 (see FIG. 7).

As depicted in FIGS. 9B and 10B, the portion 572 of the connecting electrode 57B is overlapped in the Z direction with the connecting portion 525, the end portion on the second side of the non-conductive electrode 64*b* disposed on the second side in the X direction of any other non-conductive electrode 64*b*, and the gap 72*b* disposed between these electrodes. Further, the portion 572 of the connecting electrode 57B has the length in the Y direction which is longer than those of the first surface electrode 54*b* and the second surface electrode 55*b*. The portion 572 of the connecting electrode 57B extends to the outer side as compared with the first surface electrode 54*b* and the second surface electrode 55*b* on the both sides in the Y direction. Further, the portion 572 of the connecting electrode 57B is in conduction with the connecting portion 525 via a through-hole 42*x* formed through the first piezoelectric layer 42.

The portion 571 of the connecting electrode 57B is overlapped in the X direction with the first to third branch portions 533 as counted from the right as viewed in FIG. 8, and the portion 571 is overlapped in the X direction with the seven arrays disposed on the right side as viewed in FIG. 6 of the plurality of driving electrode arrays SIR. Further, the portion 571 of the connecting electrode 57B is overlapped in the Z direction with the stem portion 522 of the high electric potential electrode 52 (see FIG. 7).

The plurality of non-conductive electrodes 66*a* are arranged between the connecting portion 535 and the portion 572 of the connecting electrode 57A, and the plurality of non-conductive electrodes 66*a* are aligned while providing spaces in the X direction. Further, the non-conductive electrodes 66*a* except for the non-conductive electrode 66*a* disposed on the second side in the X direction of any other non-conductive electrode 66*a*, which are included in the plurality of non-conductive electrodes 66*a*, extend to range over the two adjoining non-conductive electrodes 64*a* in the X direction. Then, each of the non-conductive electrodes 66*a* is overlapped in the Z direction with the end portion on the second side of the non-conductive electrode 64*a*, among the two adjoining non-conductive electrodes 64*a*, disposed on the first side, the end portion on the first side of the non-conductive electrode 64*a*, among the two adjoining non-conductive electrodes 64*a*, disposed on the second side, and the gap 72*a* disposed between the two adjoining non-conductive electrodes 64*a*.

Further, the non-conductive electrode 66*a*, which is included in the plurality of non-conductive electrodes 66*a* and which is disposed on the second side in the X direction of any other non-conductive electrode 66*a*, extends in the X direction to range over the portion 562 of the connecting electrode 56B and the non-conductive electrode 64*a* disposed on the second side in the X direction of any other non-conductive electrode 64*a*. Then, the non-conductive electrode 66*a* is overlapped in the Z direction with the end portion on the first side in the X direction of the portion 562 of the connecting electrode 56B, the end portion on the second side in the X direction of the non-conductive electrode 64*a*, and the gap 72*a* disposed therebetween.

Then, owing to the arrangement of the plurality of non-conductive electrodes 66*a* as described above, gaps 73*a* (an example of "second gaps" of the present invention), which are overlapped in the Z direction with the gaps 71*a* respectively, are formed between the portion 572 of the connecting electrode 57A and the non-conductive electrode 66*a* disposed on the first side in the X direction of any other non-conductive electrode 66*a*, between the connecting portion 535 and the non-conductive electrode 66*a* disposed on the second side in the X direction of any other non-conductive electrode 66*a*, and between the two adjoining non-conductive electrodes 66*a*. Further, owing to the arrangement as described above, the non-conductive electrode 64*a* described above is also overlapped in the Z direction with the gap 73*a* in addition to the gap 71*a*.

Further, the length L3*ax* in the X direction of the non-conductive electrode 66*a* is longer than the length L2*ax* in the X direction of the non-conductive electrode 64*a*. Further, the length L3*ay* in the Y direction of the non-conductive electrode 66*a* is longer than the length L2*ay* in the Y direction of the non-conductive electrode 64*a*. The non-conductive electrode 66*a* extends to the outer side as compared with the non-conductive electrode 64*a* on the both sides in the Y direction. Accordingly, the area (square measure) of the non-conductive electrode 66*a* is larger than the area (square measure) of the non-conductive electrode 64*a*.

The plurality of non-conductive electrodes 66*b* are arranged between the connecting portion 534 and the portion 572 of the connecting electrode 57B, and the plurality of non-conductive electrodes 66*b* are aligned while providing spaces in the X direction. Further, the non-conductive electrodes 66*b* except for the non-conductive electrode 66*b* disposed on the first side in the X direction of any other non-conductive electrode 66*b*, which are included in the plurality of non-conductive electrodes 66*b*, extend to range over the two adjoining non-conductive electrodes 64*b* in the X direction. Then, each of the non-conductive electrodes 66*b* is overlapped in the Z direction with the end portion on the second side of the non-conductive electrode 64*b*, among two adjoining non-conductive electrodes 64*b*, disposed on the first side, the end portion on the first side of the non-conductive electrode 64*b*, among two adjoining non-conductive electrodes 64*b*, disposed on the second side, and the gap 72*b* disposed between the two adjoining non-conductive electrodes 64*b*.

Further, the non-conductive electrode 66*b*, which is included in the plurality of non-conductive electrodes 66*b* and which is disposed on the first side in the X direction of any other non-conductive electrode 66*b*, extends in the X direction to range over the portion 562 of the connecting electrode 56A and the non-conductive electrode 64*b* disposed on the first side in the X direction of any other non-conductive electrode 64*b*. Then, the non-conductive electrode 66*b* is overlapped in the Z direction with the end portion on the second side in the X direction of the portion 562 of the connecting electrode 56A, the end portion on the first side in the X direction of the non-conductive electrode 64*b*, and the gap 72*b* disposed therebetween.

Then, owing to the arrangement of the plurality of non-conductive electrodes 66*h* as described above, gaps 73*b* (an example of "second gaps" of the present invention), which are overlapped in the Z direction with the gaps 71*b* respectively, are formed between the portion 572 of the connecting electrode 57B and the non-conductive electrode 66*b* disposed on the second side in the X direction of any other non-conductive electrode 66*b*, between the connecting portion 534 and the non-conductive electrode 66*b* disposed on the first side in the X direction of any other non-conductive electrode 66*b*, and between the two adjoining non-conductive electrodes 66*b*. Further, owing to the arrangement as described above, the non-conductive electrode 64*b* described above is also overlapped in the Z direction with the gap 73*b* in addition to the gap 71*b*.

Further, the length L3*bx* in the X direction of the non-conductive electrode 66*b* is longer than the length L2*bx* in the X direction of the non-conductive electrode 64*b*. Further, the length L3*by* in the V direction of the non-conductive electrode 66*b* is longer than the length L2*by* in the Y direction of the non-conductive electrode 64*b*. The non-conductive electrode 66*b* extends to the outer side as compared with the non-conductive electrode 64*b* on the both sides in the Y direction. Accordingly, the area (square measure) of the non-conductive electrode 66*b* is larger than the area (square measure) of the non-conductive electrode 64*b*.

Further, the non-conductive electrodes 66*a*, 66*b* are not in conduction with any one of the individual electrode 51, the high electric potential electrode 52, and the low electric potential electrode 53, and no electric potential is applied to the non-conductive electrodes 66*a*, 66*b*.

Further, any one of the first surface electrodes 54*a*, 54*b*, the second surface electrodes 55*a*, 55*b*, and the non-conductive electrodes 63*a*, 63*b*, which is arranged at the end portion of the actuator surface K3, does not extend to the edge of the actuator surface K3 (edge of the second piezoelectric layer 43). Further, any one of the stern portions 521, 522 of the high electric potential electrode 52, the connecting portions 524, 525, the portions 561, 562 of the connecting electrodes 56A, 56B, and the non-conductive electrodes 64*a*, 64*b*, which is arranged at the end portion of the second boundary surface K2, does not extend to the edge of the second boundary surface K2 (edges of the first piezoelectric layer 42 and the second piezoelectric layer 43). Further, any one of the stern portions 531, 532 of the low electric potential electrode 53, the connecting portions 534, 535, the portions 571, 572 of the connecting electrodes 56A, 57B, and the non-conductive electrodes 66*a*, 66*b*, which is arranged at the end portion of the first boundary surface K1, does not extend to the edge of the first boundary surface K1 (edges of the vibration plate 41 and the first piezoelectric layer 42).

Further, the thicknesses of the respective electrodes described above arranged on the first boundary surface K1, the second boundary surface K2, and the actuator surface K3 are, for example, about 0.5 to 1.5 μm.

Then, in the first embodiment, owing to the arrangement of the respective electrodes in the positional relationship as described above in the piezoelectric actuator 22, at least one electrode of the first surface electrode 54*a*, the second surface electrode 55*a*, the plurality of non-conductive electrodes 63*a*, the connecting portion 524, the portion 562 of the connecting electrode 56B, the plurality of non-conductive electrodes 64*a*, the connecting portion 535, the portion 572 of the connecting electrode 57A, and the plurality of non-conductive electrodes 66*a* is arranged irrelevant to the position in the X direction at the portion of the end portion on the first side in the Y direction of the stack of the vibration plate 41, the first piezoelectric layer 42, and the second piezoelectric layer 43, the portion being positioned within the range in which at least the plurality of individual electrodes 51 are arranged in the X direction, within the range in which the first surface electrode 54*a* and the second surface electrode 55*a* are arranged in the Y direction.

Further, at least one electrode of the first surface electrode 54*b*, the second surface electrode 55*b*, the plurality of non-conductive electrodes 63*h*, the connecting portion 525, the portion 562 of the connecting electrode 56A, the plurality of non-conductive electrodes 64*b*, the connecting portion 534, the portion 572 of the connecting electrode 57B, and the plurality of non-conductive electrodes 66*b* is arranged irrelevant to the position in the X direction at the portion of the end portion on the second side in the Y direction of the stack of the vibration plate 41, the first piezoelectric layer 42, and the second piezoelectric layer 43, the portion being positioned within the range in which at least the plurality of individual electrodes 51 are arranged in the X direction, within the range in which the first surface electrode 54*b* and the second surface electrode 55*b* are arranged in the Y direction.

<Actuator Unit>

In the piezoelectric actuator 22, as depicted in FIG. 5, the portion of the second piezoelectric layer 43, which is interposed between the individual electrode 51 and the individual portion 52*a* of the high electric potential electrode 52 in the Z direction, is the first active portion 91 which is mainly polarized in the upward direction. Further, the portions of the first piezoelectric layer 42 and the second piezoelectric layer 43, which are interposed between the individual electrode 51 and the individual portions 53*a* of the low electric potential electrode 53 in the Z direction, are the second active portions 92 which are mainly polarized in the downward direction. The piezoelectric actuator 22 has the actuator unit 90 which is configured for each of the pressure chambers 10 by the one first active portion 91 and the two second active portions 92 between which the first active portion 91 is interposed in the X direction.

An explanation will now be made about the action of the actuator unit 90 corresponding to the certain nozzle 15 when the ink is discharged from the certain nozzle 15.

Figure 11A:
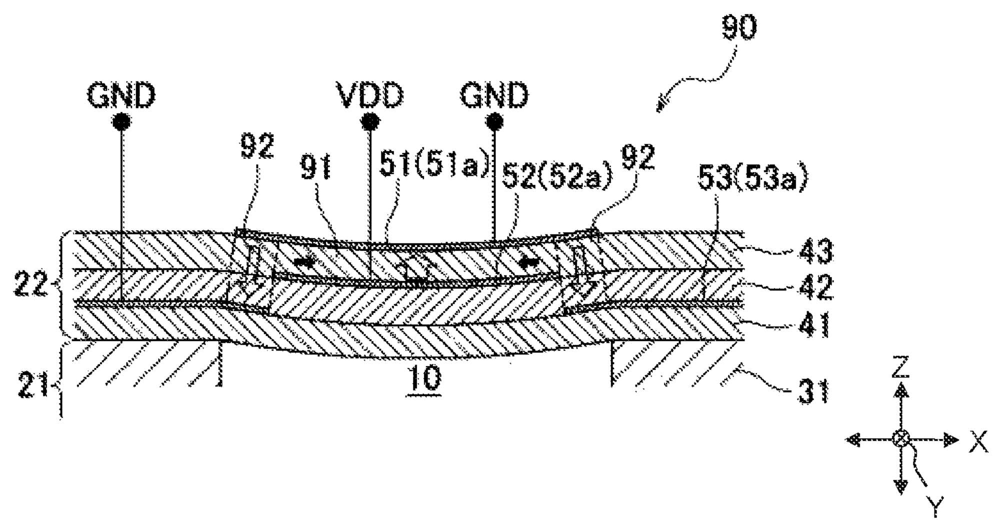
FIG. 11A depicts a state of an actuator unit 90 as viewed in the cross section shown in FIG. 5 in a state that a low electric potential (GND electric potential) is applied to an individual electrode 51.

As depicted in FIG. 11A, the low electric potential (GND electric potential) is applied to each of the individual electrodes 51 before the ink is discharged from the nozzle 15 of the head 3. In this situation, the electric field, which is directed in the upward direction that is equal to the polarization direction, is generated in the first active portion 91 by means of the difference in the electric potential between the individual electrode 51 and the high electric potential electrode 52. The first active portion 91 is shrunk in the in-plane direction (direction directed in the X direction and the Y direction). Accordingly, the portions of the vibration plate 41, the first piezoelectric layer 42, and the second piezoelectric layer 43, which are overlapped in the Z direction with the pressure chamber 10, are flexibly bent or warped so that the portions protrude toward the pressure chamber 10 (downwardly). In this situation, the pressure chamber 10 has a small volume as compared with a situation in which the first piezoelectric layer 42 and the second piezoelectric layer 43 are flat.

Figure 11B:
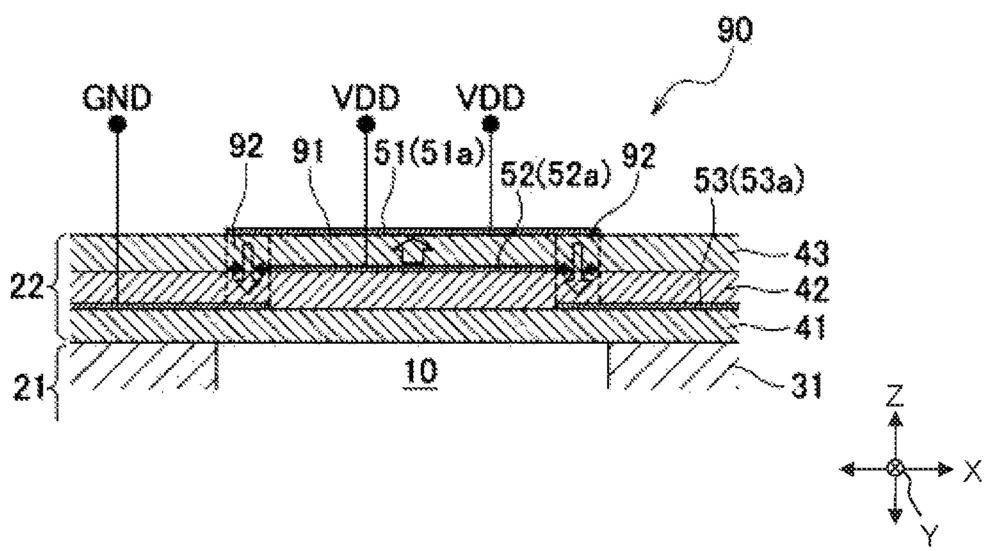
FIG. 11B depicts a state of the actuator unit 90 as viewed in the cross section shown in FIG. 5 in a state that a high electric potential (VDD electric potential) is applied to the individual electrode 51.
Figure 12A:
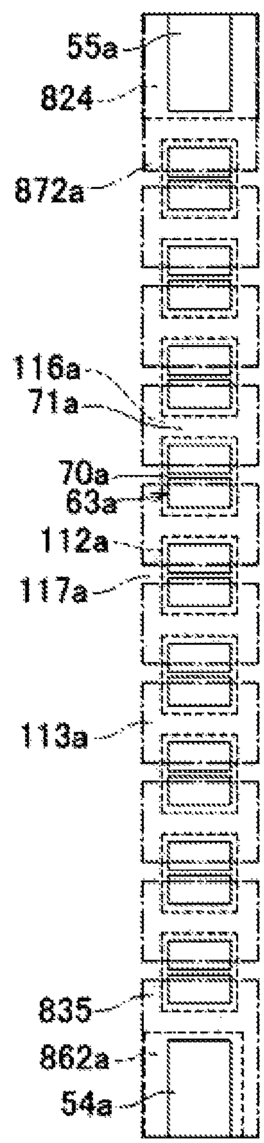
FIG. 12A is a drawing, for a piezoelectric actuator 100, corresponding to FIG. 9A.
Figure 12B:
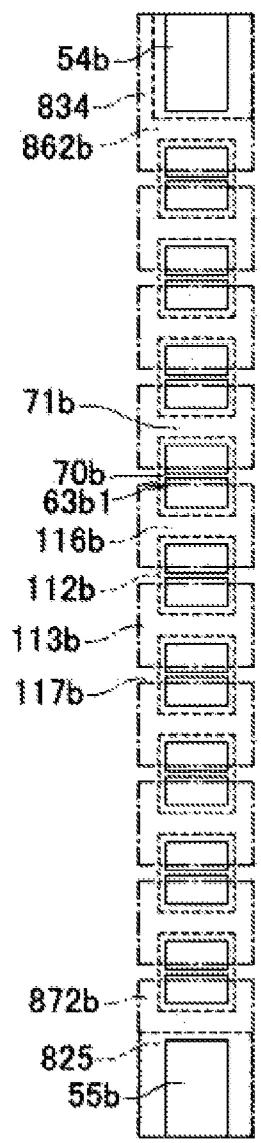
FIG. 12B is a drawing, for the piezoelectric actuator 100, corresponding to FIG. 9B.
Figure 12B:
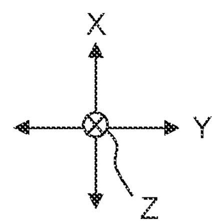
Figure 12B:
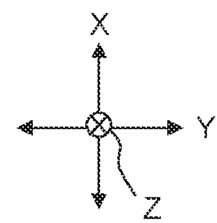
Figure 13A:
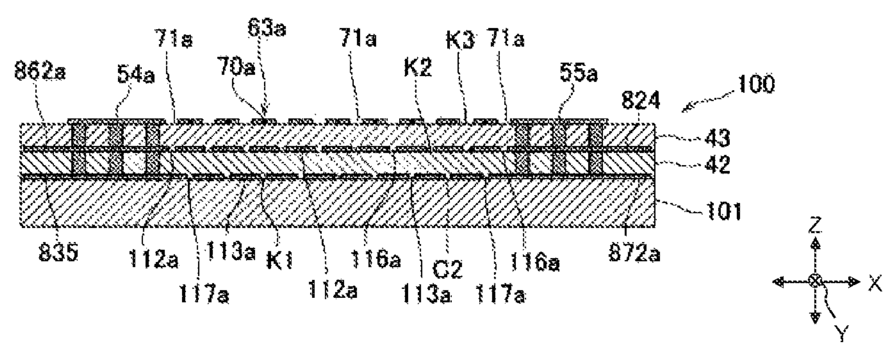
FIG. 13A is a drawing, for the piezoelectric actuator 100, corresponding to FIG. 10A.
Figure 13B:
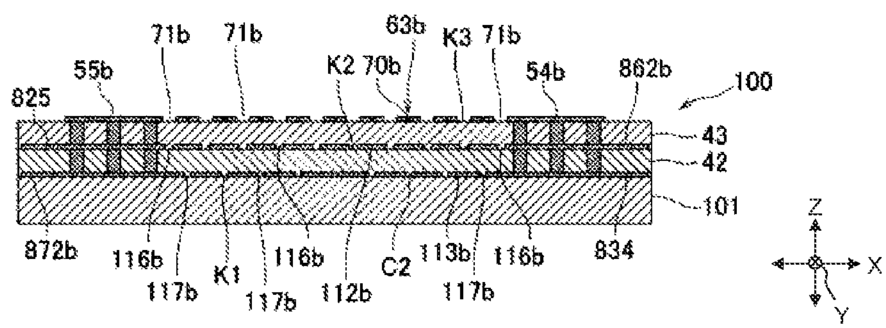
FIG. 13B is a drawing, for the piezoelectric actuator 100, corresponding to FIG. 10B.

When the ink is discharged from a certain nozzle 15, at first, as depicted in FIG. 11B, the electric potential of the individual electrode 51 corresponding to the certain nozzle 15 is switched from the low electric potential (GND electric potential) to the high electric potential (VDD electric potential). In this situation, the difference in the electric potential disappears between the individual electrode 51 and the high electric potential electrode 52, and thus the shrinkage of the first active portion 91 is canceled. On the other hand, when the difference in the electric potential appears between the individual electrode 51 and the low electric potential electrode 53, then the electric field, which is directed in the downward direction that is equal to the polarization direction thereof, is generated thereby in the second active portion 92, and the second active portion 92 is shrunk in the in-plane direction. However, the second active portion 92 is provided in order to suppress the crosstalk (such a phenomenon that the pressure fluctuation, which is accompanied by the deformation of the actuator unit 90 concerning a certain pressure chamber 10, is transmitted to another pressure chamber 10 adjacent in the X direction to the concerning pressure chamber 10). The second active portion 92 scarcely contributes to the deformation of the actuator unit 90. In other words, in this situation, the first piezoelectric layer 42 and the second piezoelectric layer 43 are in the flat state while they are not warped or flexibly bent such that the portion, which is overlapped in the Z direction with the pressure chamber 10, protrudes in the direction (in the upward direction) to make separation from the pressure chamber 10. Accordingly, the volume of the pressure chamber 10 is increased as compared with the state depicted in FIG. 11A.

After that, as depicted in FIG. 11A, the electric potential of the individual electrode 51 corresponding to the nozzle 15 is switched from the high electric potential (VDD electric potential) to the low electric potential (GND electric potential). Then, in the same manner as described above, the portions of the first piezoelectric layer 42 and the second piezoelectric layer 43, which are overlapped in the Z direction with the pressure chamber 10, are warped or flexibly bent such that the portions protrude toward the pressure chamber 10 (in the downward direction). In this situation, the large pressure is applied to the ink contained in the pressure chamber 10 by greatly decreasing the volume of the pressure chamber 10, and the ink is discharged from nozzle 15.

<Effects>

The piezoelectric actuator 22 can be produced or manufactured, for example, by calcining (burning) a stack formed by stacking sheets of the piezoelectric material to serve as the vibration plate 41, the first piezoelectric layer 42, and the second piezoelectric layer 43 on which the electrodes are formed on the surface by means of the screen printing.

When the heating is performed during the calcination of the stack, any warpage occurs in some cases in the piezoelectric actuator 22 due to the difference in the coefficient of linear expansion between the piezoelectric material for constructing the vibration plate 41, the first piezoelectric layer 42, and the second piezoelectric layer 43 and the metal material for constructing the electrodes.

In this case, as for the central portion of the piezoelectric actuator 22, the other portions of the piezoelectric actuator 22 exist at the whole circumference therearound, and hence any warpage is suppressed for the central portion by the other portions. On the contrary, as for the end portion of the piezoelectric actuator 22, any other portion of the piezoelectric actuator 22 does not exist on the outer side therefrom, and hence the warpage is hardly suppressed by the other portion. Further, the atmosphere (for example, the temperature) differs between the central portion and the end portion of the piezoelectric actuator 22 during the calcination of the piezoelectric actuator. In view of the above, the warpage easily occurs at the end portion of the piezoelectric actuator 22 as compared with the central portion of the piezoelectric actuator 22. Further, in the first embodiment, as for the vibration plate 41, the first piezoelectric layer 42, and the second piezoelectric layer 43, the length Ly in the Y direction is shorter than the length Lx in the X direction. On this account, the warpage occurs especially easily at the end portion in the Y direction of the piezoelectric actuator 22.

If the head 3 is manufactured by using the piezoelectric actuator 22 in which the warpage is large at the end portion in the Y direction, it is feared that any crack may be generated in the vibration plate 41, the first piezoelectric layer 42, and the second piezoelectric layer 43 by the force which is applied to the end portion in the Y direction of the piezoelectric actuator 22 when the piezoelectric actuator 22 is joined to the channel unit 21 and/or when COF is joined to the piezoelectric actuator 22. Further, it is feared that the discharge characteristic may differ for the ink to be discharged from the nozzle 15 between the central portion and the end portion in the Y direction in relation to the manufactured head 3.

In view of the above, in the first embodiment, as described above, the plurality of non-conductive electrodes 63*a*, 63*b*, the plurality of non-conductive electrodes 64*a*, 64*b*, and the plurality of non-conductive electrodes 66*a*, 66*b* are arranged respectively on the actuator surface K3, the second boundary surface K2, and the first boundary surface K1. Accordingly, as depicted in FIGS. 9A, 9B, 10A, and 10B, any one of the non-conductive electrodes 63*a*, 63*b*, 64*a*, 64*b*, 66*a*, 66*b* is arranged at least at the portion (in the area) the end portion on each of the first side and the second side in the Y direction of the piezoelectric actuator 22 (stack of the vibration plate 41 and the first and second piezoelectric layers 42, 43), the portion (the area) being positioned in the X direction within the range in which the plurality of individual electrodes 51 is arranged (that is, the range extending between the outermost individual electrodes 51 in the X direction), no electrodes other than the plurality of non-conductive electrode being arranged in the portion (area). As a result, any one of the electrodes of the non-conductive electrodes 63*a*, 63*b*, 64*a*, 64*b*, 66*a*, 66*b*, the first surface electrodes 54*a*, 54*b*, the second surface electrodes 55*a*, 55*b*, the connecting portions 524, 525, 534, 535, and the portions 562, 572 is arranged irrelevant to the position in the X direction at the portion in the end portions on each of the first side and the second side in the Y direction of the piezoelectric actuator 22, the portion being positioned in the X direction within the range in which the plurality of individual electrodes 51 is arranged. Accordingly, the rigidity of the end portion in the Y direction of the piezoelectric actuator 22 can be secured, and the crack can be suppressed in the vibration plate 41, the first piezoelectric layer 42, and the second piezoelectric layer 43.

Further, in the first embodiment, as depicted in FIGS. 6 to 8, the non-conductive electrodes 63*a*, 63*b*, 64*a*, 64*b*, 66*a*, 66*b* are positioned on the outer side in the Y direction as compared with the portions of the high electric potential electrode 52 and the low electric potential electrode 53 which have the same positions in the X direction as those of the respective non-conductive electrodes 63*a*, 63*b*, 64*a*, 64*b*, 66*a*, 66*b*. Accordingly, it is possible to secure the rigidity at the portions of the piezoelectric actuator 22 which are disposed on the outer side as compared with the respective portions of the high electric potential electrode 52 and the low electric potential electrode 53 in the V direction.

Further, in the first embodiment, as depicted in FIGS. 6 to 8, the position in the Y direction of the first surface electrode 54*a* is the same as the position in the Y direction of the second surface electrode 55*a*. The first surface electrode 54*a* and the second surface electrode 55*a* are arranged while providing the space in the X direction. Further, the position in the V direction of the first surface electrode 54*b* is the same as the position in the Y direction of the second surface electrode 55*b*. The first surface electrode 54*b* and the second surface electrode 55*b* are arranged while providing the space in the X direction. On the other hand, the non-conductive electrodes 63*a*, 64*a*, 66*a* are arranged between the first surface electrode 54*a* and the second surface electrode 55*a* in the X direction, and the non-conductive electrodes 63*b*, 64*b*, 66*b* are arranged between the first surface electrode 54*b* and the second surface electrode 55*b* in the X direction. Accordingly, it is possible to secure the rigidity at the portion of the end portions in the Y direction of the piezoelectric actuator 22 between the first surface electrode 54*a* and the second surface electrode 55*a* in the X direction and the portion between the first surface electrode 54*b* and the second surface electrode 55*b* in the X direction.

Further, in the first embodiment, the actuator surface K3 and the second boundary surface K2 are positioned over or above the neutral surface C1. On this account, during the calcination of the stack, the stack intends to warp so that the stack protrudes downwardly at the portions at which the non-conductive electrodes 63*a*, 63*b* are arranged and at the portions at which the non-conductive electrodes 64*a*, 64*b* are arranged.

Further, in this situation, the actuator surface K3 is disposed far from the neutral surface C1. Therefore, the portions of the piezoelectric actuator 22, at which the central portions of the non-conductive electrodes 63*a*, 63*b* are positioned in the X direction, intend to warp to a great extent. On the other hand, the second boundary surface K2 is disposed near to the neutral surface C1, Therefore, the portions of the piezoelectric actuator 22, at which the central portions of the non-conductive electrodes 64*a*, 64*b* are positioned in the X direction, do not intend to warp to a great extent so much.

In the first embodiment, the non-conductive electrodes 64*a*, 64*b* are arranged so that the non-conductive electrodes 64*a*, 64*b* are overlapped in the Z direction with the gaps 71*a* between the non-conductive electrodes 63*a*, 63*b* respectively. Accordingly, the portions (portions at which the central portions of the non-conductive electrodes 63*a*, 63*b* are positioned) which warp to a great extent and the portions (portions at which the central portions of the non-conductive electrodes 64*a*, 64*b* are positioned) which do not warp to a great extent so much are alternately aligned at the end portions in the Y direction of the piezoelectric actuator 22. In this case, the vibration plate 41, the first piezoelectric layer 42, and the second piezoelectric layer 43 can be easily made flat by being pressed, as compared with a case in which the greatly warped portions are continuously aligned in the X direction. Thus, occurrence of any crack can be suppressed in the vibration plate 41, the first piezoelectric layer 42, and the second piezoelectric layer 43.

Further, in the first embodiment, the actuator surface K3 is disposed far from the neutral surface C1 as compared with the first boundary surface K1 and the second boundary surface K2. On this account, the non-conductive electrodes 63*a*, 63*b*, which are arranged on the actuator surface K3, easily affect the warpage of the piezoelectric actuator 22 as compared with the non-conductive electrodes 64*a*, 64*b* which are arranged on the second boundary surface K2 and the non-conductive electrodes 66*a*, 66*b* which are arranged on the first boundary surface K1. In view of the above, in the first embodiment, the area (square measure) of the non-conductive electrode 63*a* arranged on the actuator surface K3 is made smaller than the areas (square measures) of the non-conductive electrode 64*a* arranged on the second boundary surface K2 and the non-conductive electrode 66*a* arranged on the first boundary surface K1. Further, the area (square measure) of the non-conductive electrode 63*b* arranged on the actuator surface K3 is made smaller than the areas (square measures) of the non-conductive electrode 64*b* arranged on the second boundary surface K2 and the non-conductive electrode 66*b* arranged on the first boundary surface K1. Accordingly, it is possible to decrease the influence on the warpage of the vibration plate 41, the first piezoelectric layer 42, and the second piezoelectric layer 43 during the calcination of the stack, exerted by the non-conductive electrodes 63*a*, 63*b*, 64*a*, 64*b*, 66*a*, 66*b*.

Further, in the first embodiment, as described above, as for the actuator surface K3, the first boundary surface K1, and the second boundary surface K2, the actuator surface K3 is disposed farthest from the neutral surface C1. Further, in the Z direction, as for the actuator surface K3, the first boundary surface K1, and the second boundary surface K2, the actuator surface K3 is positioned on the first side of other two surfaces, and the first boundary surface K1 is positioned on the second side of other two surfaces. Therefore, the areas (square measures) of the non-conductive electrodes 66_a_, 66_b_ arranged on the first boundary surface K1 are increased, while the non-conductive electrodes 63_a_, 63_b_ are arranged on the actuator surface K3. Accordingly, it is possible to maximally suppress the influence on the warpage of the vibration plate 41, the first piezoelectric layer 42, and the second piezoelectric layer 43 during the calcination of the stack, exerted by the non-conductive electrodes 63_a_, 63_b_ arranged on the actuator surface K3.

Further, in the first embodiment, the respective electrodes, which are arranged at the end portions of the actuator surface K3, the first boundary surface K1, and the second boundary surface K2, do not extend to the edges of the surfaces on which they are arranged. Accordingly, it is possible to prevent the respective electrodes arranged at the end portions of the actuator surface K3, the first boundary surface K1, and the second boundary surface K2 from being in conduction with, for example, the channel unit 21 and/or any electrode arranged on any other surface of the piezoelectric actuator 22 via the end surfaces in the X direction and the Y direction of the piezoelectric actuator 22.

Second Embodiment

Next, a second embodiment of the present disclosure will be explained. As depicted in FIGS. 12A, 12B, 13A, and 13B, a piezoelectric actuator 100 according to the second embodiment has a thickness (length in the Z direction) of a vibration plate 101 which is larger than the thickness of the first piezoelectric layer 42 and the thickness of the second piezoelectric layer 43. For example, each of the thicknesses of the first piezoelectric layer 42 and the second piezoelectric layer 43 is about 5 μm, while the thickness of the vibration plate 101 is about 10 μm. Accordingly, a neutral surface C2 of a stack of the vibration plate 101, the first piezoelectric layer 42, and the second piezoelectric layer 43 is positioned in the vicinity of the first boundary surface K1 which is the surface disposed between the vibration plate 101 and the first piezoelectric layer 42.

Further, in the case of the piezoelectric actuator 100, a plurality of non-conductive electrodes 112_a_ (an example of "second non-conductive electrodes" of the present invention) are aligned while providing spaces therebetween in the X direction between a connecting portion 824 which corresponds to the connecting portion 524 of the first embodiment and a portion 862_a_ which corresponds to the portion 562 of the connecting electrode 56B of the first embodiment on the second boundary surface K2.

The connecting portion 824 is overlapped in the Z direction with the second surface electrode 55_a_. However, the connecting portion 824 does not extend to the position at which the connecting portion 824 will be overlapped in the Z direction with the non-conductive electrode 63_a_ disposed on the first side in the X direction of any other non-conductive electrode 63_a_. The portion 862_a_ is overlapped in the Z direction with the first surface electrode 54_a_. However, the portion 862_a_ does not extend to the position at which the portion 862_a_ will be overlapped in the Z direction with the non-conductive electrode 63_a_ disposed on the second side in the X direction of any other non-conductive electrode 63_a_.

The plurality of non-conductive electrodes 112_a_ are provided individually with respect to the plurality of non-conductive electrodes 63_a_. Each of the non-conductive electrodes 112_a_ is overlapped in the Z direction with the corresponding non-conductive electrode 63_a_. Further, in the X direction, the position of the center of the non-conductive electrode 63_a_ (center of the gap 70_a_) is the same as the position of the center of the non-conductive electrode 112_a_.

Further, owing to the arrangement of the connecting portion 824, the portion 862_a_, and the plurality of non-conductive electrodes 112_a_ as described above, gaps 116_a_ an example of "second gaps" of the present invention), which are overlapped in the Z direction with the gaps 71_a_, are formed between the two adjoining non-conductive electrodes 112_a_, between the connecting portion 824 and the non-conductive electrode 112_a_ disposed on the first side in the X direction of any other non-conductive electrode 112_a_, and between the portion 862_a_ and the non-conductive electrode 112_a_ disposed one the second side in the X direction of any other non-conductive electrode 112_a_.

Further, in the case of the piezoelectric actuator 100, a plurality of non-conductive electrodes 112_b_ (an example of "second non-conductive electrodes" of the present invention) are aligned while providing spaces therebetween in the X direction between a connecting portion 825 which corresponds to the connecting portion 525 of the first embodiment and a portion 862_b_ which corresponds to the portion 562 of the connecting electrode 56A of the first embodiment on the second boundary surface K2.

The connecting portion 825 is overlapped in the Z direction with the second surface electrode 55_b_. However, the connecting portion 825 does not extend to the position at which the connecting portion 825 will be overlapped in the Z direction with the non-conductive electrode 63_b_ disposed on the second side in the X direction of any other non-conductive electrode 63_b_. The portion 862_b_ is overlapped in the Z direction with the first surface electrode 54_b_. However, the portion 862_b_ does not extend to the position at which the portion 862_b_ will be overlapped in the Z direction with the non-conductive electrode 63_b_ disposed on the first side in the X direction of any other non-conductive electrode 63_b_.

The plurality of non-conductive electrodes 112_b_ are provided individually with respect to the plurality of non-conductive electrodes 63_b_. Each of the non-conductive electrodes 112_b_ is overlapped in the Z direction with the corresponding non-conductive electrode 63_b_. Further, in the X direction, the position of the center of the non-conductive electrode 63_b_ (center of the gap 70_b_ is the same as the position of the center of the non-conductive electrode 112_b_.

Further, owing to the arrangement of the connecting portion 825, the portion 862_b_, and the plurality of non-conductive electrodes 112_b_ as described above, gaps 116_b_ (an example of "second gaps" of the present invention), which are overlapped in the Z direction with the gaps 71_b_, are formed between the two adjoining non-conductive electrodes 112_b_, between the portion 862_b_ and the non-conductive electrode 112_b_ disposed on the first side in the X direction of any other non-conductive electrode 112_a_, and between the connecting portion 825 and the non-conductive electrode 112_b_ disposed on the second side in the X direction of any other non-conductive electrode 112_b_.

Further, in the case of the piezoelectric actuator 100, a plurality of non-conductive electrodes 113_a_. (an example of "third non-conductive electrode" of the present invention) are aligned while providing spaces therebetween in the X direction between a connecting portion 835 which corresponds to the connecting portion 535 of the first embodiment and a portion 872_a_ which corresponds to the portion 572 of the connecting electrode 57A of the first embodiment on the first boundary surface K1. Further, gaps 117_a_ are formed thereby between the connecting portion 835 and the non-conductive electrode 113_a_ disposed on the second side in the X direction of any other non-conductive electrode 113_a_, between the portion 872*a* and the non-conductive electrode 113*a* disposed on the first side in the X direction of any other non-conductive electrode 113*a*, and between the two adjoining non-conductive electrodes 113*a*.

The connecting portion 835 is overlapped in the Z direction with the portion 862*a* and the portion on the second side of the non-conductive electrode 112*a* disposed on the second side in the X direction of any other non-conductive electrode 112*a*. The portion 872*a* is overlapped in the Z direction with the connecting portion 824 and the portion on the first side of the non-conductive electrode 112*a* disposed on the first side in the X direction of any other non-conductive electrode 112*a*.

Each of the non-conductive electrodes 113*a* extends in the X direction to range over the two adjoining non-conductive electrodes 112*a*. Then, each of the non-conductive electrodes 113*a* is overlapped in the Z direction with the portion on the second side of the non-conductive electrode 112*a*, among the two adjoining non-conductive electrodes 112*a*, disposed on the first side in the X direction and the portion on the first side of the non-conductive electrode 112*a*, among the two adjoining non-conductive electrodes 112*a*, disposed on the second side in the X direction.

Further, owing to the arrangement of the connecting portion 835, the portion 872*a*, and the plurality of non-conductive electrodes 113*a* as described above, the connecting portion 835 is overlapped in the Z direction with the gaps 71*a*, 116*a* disposed on the second side in the X direction of any other gaps 71*a*, 116*a*. Further, the portion 872*a* is overlapped in the Z direction with the gaps 71*a*, 116*a* disposed on the first side in the X direction of any other gaps 71*a*. 116*a*. Further, the non-conductive electrode 113*a* is overlapped in the Z direction with the gap 71*a* disposed between the two adjoining non-conductive electrodes 63*a* and the gap 116*a* disposed between the two adjoining non-conductive electrodes 112*a*.

Further, in the case of the piezoelectric actuator 100, a plurality of non-conductive electrodes 113*b* (an example of "third non-conductive electrode" of the present invention) are arranged between a connecting portion 834 which corresponds to the connecting portion 534 of the first embodiment and a portion 872*b* which corresponds to the portion 572 of the connecting electrode 57B of the first embodiment on the first boundary surface K1. Further, gaps 117*b* are formed thereby between the connecting portion 834 and the non-conductive electrode 113*b* disposed on the first side in the X direction of any other non-conductive electrode 113*b*, between the portion 872*b* and the non-conductive electrode 113*b* disposed on the second side in the X direction of any other non-conductive electrode 113*b*, and between the two adjoining non-conductive electrodes 113*b*.

The connecting portion 834 is overlapped in the Z direction with the portion 862*b* and the portion on the first side of the non-conductive electrode 112*b* disposed on the first side in the X direction of any other non-conductive electrode 112*b*. The portion 872*b* is overlapped in the Z direction with the connecting portion 825 and the portion on the second side of the non-conductive electrode 112*b* disposed on the second side in the X direction of any other non-conductive electrode 112*b*.

Each of the non-conductive electrodes 113*b* extends in the X direction to range over the two adjoining non-conductive electrodes 112*b*. Then, each of the non-conductive electrodes 113*b* is overlapped in the Z direction with the portion on the second side of the non-conductive electrode 112*b*, among the two adjoining non-conductive electrodes 112*b*, disposed on the first side in the X direction and the portion on the first side of the non-conductive electrode 112*b*, among the two adjoining non-conductive electrodes 112*b*, disposed on the second side in the X direction.

Further, owing to the arrangement of the connecting portion 834, the portion 872*b*, and the plurality of non-conductive electrodes 113*b* as described above, the connecting portion 834 is overlapped in the Z direction with the gaps 71*b*, 116*b* disposed on the first side in the X direction of any other gaps 71*b*, 116*b*. Further, the portion 872*b* is overlapped in the Z direction with the gaps 71*b*, 116*b* disposed on the second side in the X direction of any other gaps 71*b*, 116*b*. Further, the non-conductive electrode 113*b* is overlapped in the Z direction with the gap 71*b* disposed between the two adjoining non-conductive electrodes 63*b* and the gap 116*b* disposed between the two adjoining non-conductive electrodes 112*b*.

<Effects>

In the second embodiment, as depicted in FIGS. 12A, 12B, 13A, and 13B, any one of the non-conductive electrodes 63*a*, 63*b*, 112*a*, 112*b*, 113*a*, 113*b* is arranged at least at the portion (in the area) in the end portion on each of the first side and the second side in the Y direction of the piezoelectric actuator 100 (stack of the vibration plate 101 and the first and second piezoelectric layers 42, 43), the portion (the area) being positioned in the X direction within the range in which the plurality of individual electrodes 51 is arranged, no electrodes other than the plurality of non-conductive electrode being arranged in the portion (area). As a result, any one of the electrodes of the non-conductive electrodes 63*a*, 63*b*, 112*a*, 112*b*, 113*a*, 113*b*, the first surface electrodes 54*a*, 54*b*, the second surface electrodes 55*a*, 55*b*, the connecting portions 824, 825, 834, 835, and the portions 862*a*, 862*b*, 872*a*, 872*b* is arranged irrelevant to the position in the X direction at the portion in the end portion on each of the first side and the second side in the Y direction of the piezoelectric actuator 100, the portion being positioned in the X direction within the range in which the plurality of individual electrodes 51 is arranged. Accordingly, the rigidity of the end portion can be secured in the Y direction of the piezoelectric actuator 100, and the crack can be suppressed in the vibration plate 101, the first piezoelectric layer 42, and the second piezoelectric layer 43.

In the second embodiment, the actuator surface K3 and the second boundary surface K2 are disposed far from the neutral surface C2, while the first boundary surface K1 is disposed near to neutral surface C2. On the other hand, in the second embodiment, the gaps 116*a*, 116*b* between the non-conductive electrodes 112*a*, 112*b* are overlapped in the Z direction with the gaps 71*a*, 71b between the non-conductive electrodes 63*a*, 63*b* respectively. Thus, the central portions in the X direction of the non-conductive electrodes 63*a*, 63*b* are overlapped in the Z direction with the central portions in the X direction of the non-conductive electrodes 116*a*, 116*b* respectively. Therefore, the portions of the stack, at which the central portions of the non-conductive electrodes 63*a*, 63*b*, 112*a*, 112*b* are positioned in the X direction, intend to warp to a great extent during the calcination of the stack of the vibration plate 101, the first piezoelectric layer 42, and the second piezoelectric layer 43.

On the other hand, in the second embodiment, the central portion in the X direction of the non-conductive electrode 113*a* is overlapped in the Z direction with the gap 71*a* between the non-conductive electrodes 63*a* and the gap 116*a* between the non-conductive electrodes 112*a* The central portion in the X direction of the non-conductive electrode 113*b* is overlapped in the Z direction with the gap 71*b* between the non-conductive electrodes 63*b* and the gap 116*b* between the non-conductive electrodes 112*b*. Therefore, the portions of the stack, at which the central portions of the non-conductive electrodes 113*a*, 113*b* are positioned in the X direction, do not intend to warp to a great extent so much during the calcination of the stack.

According to the fact as described above, in the piezoelectric actuator 100, the portions which warp to a great extent (portions at which the central portions of the non-conductive electrodes 63*a*, 63*b*, 112*a*, 112*b* are positioned) and the portions which do not warp to a great extent so much (portions at which the central portions of the non-conductive electrodes 113*a*, 113*b* are positioned) are alternately aligned in the X direction. In this case, the vibration plate 101, the first piezoelectric layer 42, and the second piezoelectric layer 43 can be easily made flat by being pressed, as compared with a case in which the greatly warped portions are continuously aligned in the X direction, Thus, occurrence of any crack can be suppressed in the vibration plate 101, the first piezoelectric layer 42, and the second piezoelectric layer 43.

The preferred first and second embodiments of the present disclosure have been explained above. However, the present disclosure is not limited to the first and second embodiments, which can be variously modified or changed within a scope defined in claims.

In the first and second embodiments, the electrodes, which are arranged at the end portions of the respective surfaces of the piezoelectric actuator, do not extend to the edges (edge of any one of the vibration plate and the first and second piezoelectric layers) of the surfaces on which the electrodes are arranged. However, there is no limitation thereto. At least some of the electrodes included in the electrodes arranged at the end portions of the respective surfaces of the piezoelectric actuator may extend to the edges of the surfaces on which the electrodes are arranged.

Further, in the first embodiment, the areas (square measures) of the non-conductive electrodes 63*a*, 63*b* arranged on the actuator surface K3 are smaller than the areas (square measures) of the non-conductive electrodes 64*a*, 64*b* arranged on the second boundary surface K2 respectively. Further, the areas of the non-conductive electrodes 64*a*, 64*b* arranged on the second boundary surface K2 are smaller than the areas of the non-conductive electrodes 66*a*, 66*b* arranged on the first boundary surface K1. However, there is no limitation thereto.

For example, the area of the non-conductive electrode 64*a* arranged on the second boundary surface K2 may be not less than the area of the non-conductive electrode 66*a* arranged on the first boundary surface K1, and the area of the non-conductive electrode 64*b* arranged on the second boundary surface K2 may be not less than the area of the non-conductive electrode 66*b* arranged on the first boundary surface K1. Further, the area of the non-conductive electrode 63*a* arranged on the actuator surface K3 may be not less than the area of the non-conductive electrode 64*a* arranged on the second boundary surface K2, and the area of the non-conductive electrode 63*b* arranged on the actuator surface K3 may be not less than the area of the non-conductive electrode 64*b* arranged on the second boundary surface K2.

The same or equivalent relationship also holds for the magnitude correlation among the areas of the non-conductive electrode 63*a*, the non-conductive electrode 112*a*, and the non-conductive electrodes 113*a* and the magnitude correlation among the areas of the non-conductive electrode 63*b*, the non-conductive electrode 112*b*, and the non-conductive electrodes 113*b* in the second embodiment.

Further, the magnitude correlation among the thicknesses (lengths in the Z direction) of the vibration plate and the first and second piezoelectric layers may be different from that explained in the second embodiment. Then, also in this case, the following arrangement may be applied. That is, the gap (an example of "second gap" of the present invention) between the non-conductive electrodes (an example of "second non-conductive electrodes" of the present invention) arranged on the surface which is included in the first boundary surface and the second boundary surface and which is disposed far from the neutral surface is overlapped in the Z direction with the gap (an example of "first gap" of the present invention) between the non-conductive electrodes (an example of "first non-conductive electrodes" of the present invention) arranged on the actuator surface. The non-conductive electrode (an example of "third non-conductive electrode" of the present invention), which is arranged on the surface disposed near to the neutral surface, is overlapped in the Z direction with the gap between the non-conductive electrodes arranged on the actuator surface and the gap between the non-conductive electrodes arranged on the surface disposed far from the neutral surface. By doing so, the vibration plate, the first piezoelectric layer, and the second piezoelectric layer can be easily made flat by being pressed in the same manner as explained in the first and second embodiments. Thus, occurrence of a crack can be suppressed in the vibration plate, the first piezoelectric layer, and the second piezoelectric layer.

Further, irrelevant to the magnitude correlation among the thicknesses (lengths in the Z direction) of the vibration plate and the first and second piezoelectric layers, the gap between the non-conductive electrodes arranged on the surface disposed near to the neutral surface may be overlapped in the Z direction with the gap between the non-conductive electrodes arranged on the actuator surface, and the non-conductive electrode, which is arranged on the surface far from the neutral surface, may be overlapped in the Z direction with the gap between the non-conductive electrodes arranged on the actuator surface and the gap between the non-conductive electrodes arranged on the surface disposed near to the neutral surface.

Further, in the first and second embodiments, the positions in the Y direction of the first surface electrode 54*a* and the second surface electrode 55*a* are the same as the positions in the Y direction of the first surface electrode 54*b* and the second surface electrode 55*b*. The first surface electrode 54*a* and the second surface electrode 55*a* as well as the first surface electrode 54*b* and the second surface electrode 55*b* are arranged while providing the spaces in the X direction. Then, in the X direction, the non-conductive electrodes are arranged between the first surface electrode 54*a* and the second surface electrode 55*a* and between the first surface electrode 54*b* and the second surface electrode 55*b*. However, there is no limitation thereto.

For example, the first surface electrode 54*a* and the second surface electrode 55*a* may be arranged adjacent to each other at the central portion in the X direction of the end portion in the Y direction of the actuator surface K3. Corresponding thereto, the connecting portion and the connecting electrode, which are in conduction with the first surface electrode 54*a* and the second surface electrode 55*a* via the through-holes, may be also arranged at the central portions in the X direction of the end portions in the Y direction of the first boundary surface K1 and the second boundary surface K2. Then, the non-conductive electrode may be arranged on the outer side in the X direction as compared with the first surface electrode 54*a* and the second surface electrode 55*a*.

Similarly, the first surface electrode 54*b* and the second surface electrode 55*b* may be arranged adjacent to each other at the central portion in the X direction of the end portion in the Y direction of the actuator surface K3. Corresponding thereto, the connecting portion and the connecting electrode, which are in conduction with the first surface electrode 54*b* and the second surface electrode 55*b* via the through-holes, may be also arranged at the central portions in the X direction of the end portions in the Y direction of the first boundary surface K1 and the second boundary surface K2. Then, the non-conductive electrode may be arranged on the outer side in the X direction as compared with the first surface electrode 54*b* and the second surface electrode 55*b*.

Further, in the first and second embodiments, the length Ly in the Y direction of the piezoelectric actuator is shorter than the length Lx in the X direction. However, there is no limitation thereto. The length Ly may be not less than the length Lx.

Further, in the first and second embodiments, the non-conductive electrodes are arranged on all of the actuator surface, the first boundary surface, and the second boundary surface. However, there is no limitation thereto. The non-conductive electrodes may be arranged on only two surfaces of the actuator surface, the first boundary surface, and the second boundary surface.

Note that in the first and second embodiments, the non-conductive electrodes 63*a*, 63*b*, 64*a*, 64*b*, 65, 66*a*, 66*b* can be also captured or grasped as metal films or metal layers rather than the non-conductive electrodes. The metal films (metal layers) may be formed of the material same as the material of the individual electrode 51, the high electric potential electrode 52, and/or the low electric potential electrode 53.

Further, in the foregoing description, the exemplary case has been explained, in which the present disclosure is applied to the piezoelectric actuator for constructing the head for discharging the inks from the nozzles. However, there is no limitation thereto. The present disclosure can be also applied to any piezoelectric actuator for constructing any apparatus or device other than the head.

What is claimed is:

1. A piezoelectric actuator comprising:

a vibration plate having insulation performance at least on a first surface, of the vibration plate, disposed on a first side in a first direction of the vibration plate;

a first piezoelectric layer arranged on the first surface of the vibration plate;

a second piezoelectric layer arranged on a first surface, of the first piezoelectric layer, disposed on the first side in the first direction of the first piezoelectric layer;

a plurality of individual electrodes arranged on an actuator surface, of the second piezoelectric layer, disposed on the first side in the first direction of the second piezoelectric layer;

a first common electrode which is arranged on a first boundary surface between the vibration plate and the first piezoelectric layer and which is common to the plurality of individual electrodes;

a second common electrode which is arranged on a second boundary surface between the first piezoelectric layer and the second piezoelectric layer and which is common to the plurality of individual electrodes;

a first surface electrode which is arranged on the actuator surface at an end portion of the actuator surface in a second direction orthogonal to the first direction, and which is in conduction with the first common electrode;

a second surface electrode which is arranged on the actuator surface at an end portion of the actuator surface in the second direction, and which is in conduction with the second common electrode; and a plurality of non-conductive electrodes which is arranged at end portions in the second direction of at least two surfaces of the actuator surface, the first boundary surface, and the second boundary surface, and which is not in conduction with any of the plurality of individual electrodes, the first common electrode, and the second common electrode, wherein:

the plurality of non-conductive electrodes is arranged at least in an area of an end portion in the second direction of a stack of the vibration plate, the first piezoelectric layer, and the second piezoelectric layer, the area being positioned, in a third direction orthogonal to the first and second directions, within a range in which the plurality of individual electrodes is arranged, no electrode other than the plurality of non-conductive electrodes being arranged in the area.

2. The piezoelectric actuator according to claim 1, wherein lengths in the third direction of the vibration plate, the first piezoelectric layer, and the second piezoelectric layer are longer than lengths in the second direction of the vibration plate, the first piezoelectric layer, and the second piezoelectric layer, respectively.

3. The piezoelectric actuator according to claim 1, wherein each of the plurality of non-conductive electrodes is positioned on an outer side in the second direction as compared with portions of the first common electrode and the second common electrode having positions in the third direction same as a position in the third direction of the each of the plurality of non-conductive electrodes.

4. The piezoelectric actuator according to claim 1, wherein:

the first surface electrode has a position in the second direction same as a position in the second direction of the second surface electrode, the first surface electrode and the second surface electrode being arranged in the third direction with a space; and the plurality of non-conductive electrodes is arranged in areas of the at least two surfaces disposed between the first surface electrode and the second surface electrode in the third direction.

5. The piezoelectric actuator according to claim 1, wherein:

the plurality of non-conductive electrodes includes:

a plurality of first non-conductive electrodes which is arranged on the actuator surface and which is arranged in the third direction with a first gap;

a plurality of second non-conductive electrodes which is arranged on a farther surface and which is arranged in the third direction with a second gap overlapped in the first direction with the first gap, the farther surface being one of the first and second boundary surfaces disposed farther from a neutral surface of the stack of the vibration plate, the first piezoelectric layer, and the second piezoelectric layer as compared with the other of the first and second boundary surfaces; and a third non-conductive electrode which is arranged on a nearer surface so as to be overlapped in the first direction with the first gap and the second gap, the nearer surface being one of the first and second boundary surfaces disposed nearer to the neutral surface as compared with the other of the first and second boundary surfaces.

6. The piezoelectric actuator according to claim 5, wherein:

the second boundary surface is the nearer surface owing to identical lengths in the first direction of the vibration plate, the first piezoelectric layer, and the second piezoelectric layer;

the plurality of second non-conductive electrodes is arranged on the first boundary surface; and the third non-conductive electrode is arranged on the second boundary surface.

7. The piezoelectric actuator according to claim 5, wherein:

the first boundary surface is the nearer surface owing to a length in the first direction of the vibration plate which is longer than lengths in the first direction of the first piezoelectric layer and the second piezoelectric layer;

the plurality of second non-conductive electrodes is arranged on the second boundary surface; and the third non-conductive electrode is arranged on the first boundary surface.

8. The piezoelectric actuator according to claim 1, wherein:

the plurality of non-conductive electrodes is arranged on the actuator surface, the first boundary surface, and the second boundary surface; and an area of each of the plurality of non-conductive electrodes arranged on the actuator surface is smaller than an area of each of the non-conductive electrodes arranged on the first boundary surface and an area of each of the non-conductive electrodes arranged on the second boundary surface.

9. The piezoelectric actuator according to claim 8, wherein the area of each of the plurality of non-conductive electrodes arranged on the second boundary surface is smaller than the area of each of the plurality of non-conductive electrodes arranged on the first boundary surface.

10. The piezoelectric actuator according to claim 1, wherein the non-conductive electrodes do not extend to edges of the vibration plate, the first piezoelectric layer, and the second piezoelectric layer in the second direction.

11. The piezoelectric actuator according to claim 1, wherein the plurality of non-conductive electrodes is aligned in the first direction in the area of the end portion in the second direction of the stack, such that no gap exists between the plurality of non-conductive electrodes as viewed in the first direction.

12. The piezoelectric actuator according to claim 1, wherein at least one of the plurality of non-conductive electrodes includes a first portion and a second portion aligned in the third direction with a gap, and a distance in the third direction between the first and second portions is smaller than a distance in the third direction between two non-conductive electrodes, of the plurality of non-conductive electrodes, adjacent to each other.

* * * * *